United States Patent
Arnone et al.

(10) Patent No.: US 10,181,693 B2
(45) Date of Patent: *Jan. 15, 2019

(54) LASER SOURCE ASSEMBLY WITH THERMAL CONTROL AND MECHANICALLY STABLE MOUNTING

(71) Applicant: DAYLIGHT SOLUTIONS, INC., San Diego, CA (US)

(72) Inventors: David F. Arnone, Mountain View, CA (US); David P. Caffey, San Diego, CA (US); Michael Pushkarsky, San Diego, CA (US); Miles Weida, Poway, CA (US)

(73) Assignee: Daylight Solutions, Inc., San Diego, CA (US)

(*) Notice: Subject to any disclaimer, the term of this patent is extended or adjusted under 35 U.S.C. 154(b) by 320 days.

This patent is subject to a terminal disclaimer.

(21) Appl. No.: 14/968,113

(22) Filed: Dec. 14, 2015

(65) Prior Publication Data

US 2016/0111853 A1    Apr. 21, 2016
US 2017/0373465 A9    Dec. 28, 2017

Related U.S. Application Data

(63) Continuation of application No. 13/240,889, filed on Sep. 22, 2011, now Pat. No. 9,225,148.
(Continued)

(51) Int. Cl.
*H01S 5/022* (2006.01)
*H01S 5/34* (2006.01)
(Continued)

(52) U.S. Cl.
CPC .......... *H01S 5/02236* (2013.01); *F41G 7/224* (2013.01); *F41H 11/02* (2013.01);
(Continued)

(58) Field of Classification Search
CPC ............. H01S 5/02236; H01S 5/02248; H01S 5/4087; H01S 5/3401; H01S 5/02469;
(Continued)

(56) References Cited

U.S. PATENT DOCUMENTS 2,684,015 A    7/1954   Grey
3,782,832 A    1/1974   Hacskaylo
(Continued)

FOREIGN PATENT DOCUMENTS

DE    10205310 A1    9/2003
EP    0877 454 A1    11/1998
(Continued)

OTHER PUBLICATIONS

US 7,733,928, 06/2010, Marsland, Jr. et al. (withdrawn)
(Continued)

*Primary Examiner* — Xinning(Tom) Niu

(57) ABSTRACT

A laser source (340) that generates an output beam (354) that is directed along a beam axis (354A) that is coaxial with a first axis and orthogonal to a second axis comprises a first frame (356), a laser (358), and a first mounting assembly (360). The laser (358) generates the output beam (354) that is directed along the beam axis (354A). The first mounting assembly (360) couples the laser (358) to the first frame (356). The first mounting assembly (360) allows the laser (358) to expand and contract relative to the first frame (356) along the first axis and along the second axis, while maintaining alignment of the output beam (354) so the beam axis (354A) is substantially coaxial with the first axis. The first mounting assembly (360) can include a first fastener assembly (366) that couples the laser (358) to the first frame (356), and a first alignment assembly (368) that maintains alignment of the laser (358) along a first alignment axis (370) that is substantially parallel to the first axis.

20 Claims, 8 Drawing Sheets

Related U.S. Application Data

(60) Provisional application No. 61/385,864, filed on Sep. 23, 2010.

(51) Int. Cl.
| | |
|---|---|
| *H01S 5/40* | (2006.01) |
| *F41H 13/00* | (2006.01) |
| *F41G 7/22* | (2006.01) |
| *G01S 7/495* | (2006.01) |
| *F41H 11/02* | (2006.01) |
| *G01S 7/481* | (2006.01) |
| *H01S 5/024* | (2006.01) |
| *H01S 5/02* | (2006.01) |
| *H01S 5/068* | (2006.01) |
| *H01S 5/14* | (2006.01) |

(52) U.S. Cl.
CPC ........ *F41H 13/0056* (2013.01); *G01S 7/4814* (2013.01); *G01S 7/495* (2013.01); *H01S 5/02248* (2013.01); *H01S 5/02469* (2013.01); *H01S 5/3401* (2013.01); *H01S 5/4087* (2013.01); *H01S 5/02* (2013.01); *H01S 5/02224* (2013.01); *H01S 5/02415* (2013.01); *H01S 5/02423* (2013.01); *H01S 5/06804* (2013.01); *H01S 5/141* (2013.01)

(58) Field of Classification Search
CPC ............. H01S 5/02415; H01S 5/02423; H01S 5/06804; H01S 5/141; H01S 5/02224; H01S 5/02; F41G 7/224; F41H 11/02; F41H 13/0056; G01S 7/4814; G01S 7/495
See application file for complete search history.

(56) References Cited

U.S. PATENT DOCUMENTS

| | | | |
|---|---|---|---|
| 4,266,873 A | 5/1981 | Hacskaylo |
| 4,470,662 A | 9/1984 | Mumzhiu |
| 4,555,627 A | 11/1985 | McRae, Jr. |
| 4,656,641 A | 4/1987 | Scifres et al. |
| 4,737,028 A | 4/1988 | Smith |
| 4,745,276 A | 5/1988 | Broicher et al. |
| 4,772,789 A | 9/1988 | Maram et al. |
| 4,796,266 A | 1/1989 | Banwell et al. |
| 4,852,956 A | 8/1989 | Kramer |
| 4,871,916 A | 10/1989 | Scott |
| 5,005,934 A | 4/1991 | Curtiss |
| 5,050,176 A | 9/1991 | Naito et al. |
| 5,056,097 A | 10/1991 | Meyers |
| 5,064,988 A | 11/1991 | E'nama et al. |
| 5,068,867 A | 11/1991 | Hasenberg et al. |
| 5,082,339 A | 1/1992 | Linnebach |
| 5,082,799 A | 1/1992 | Holmstrom et al. |
| 5,118,186 A | 6/1992 | Schraetzenstaller et al. |
| 5,140,599 A | 8/1992 | Trutna, Jr. et al. |
| 5,161,408 A | 11/1992 | McRae et al. |
| 5,172,390 A | 12/1992 | Mooradian |
| 5,181,214 A | 1/1993 | Berger et al. |
| 5,208,417 A | 5/1993 | Langer et al. |
| 5,225,679 A | 7/1993 | Clarke et al. |
| 5,255,073 A | 10/1993 | Wallin et al. |
| 5,264,368 A | 11/1993 | Clarke et al. |
| 5,315,436 A | 5/1994 | Lowehnar et al. |
| 5,331,651 A | 7/1994 | Becker et al. |
| 5,355,609 A | 10/1994 | Schenke |
| 5,430,293 A | 7/1995 | Sato et al. |
| 5,457,709 A | 10/1995 | Capasso et al. |
| 5,476,385 A | 12/1995 | Parikh et al. |
| 5,491,714 A | 2/1996 | Kitamura |
| 5,523,569 A | 6/1996 | Hornfeld et al. |
| 5,537,432 A | 7/1996 | Mehuys et al. |
| 5,656,813 A | 8/1997 | Moore et al. |
| 5,662,819 A | 9/1997 | Kadomura |
| 5,671,561 A | 9/1997 | Johnson et al. |
| 5,685,636 A | 11/1997 | German |
| 5,751,830 A | 5/1998 | Hutchinson |
| 5,752,100 A | 5/1998 | Schrock |
| 5,780,724 A | 7/1998 | Olender et al. |
| 5,790,575 A | 8/1998 | Zamel et al. |
| 5,824,884 A | 10/1998 | Olender et al. |
| 5,834,632 A | 11/1998 | Olender et al. |
| 5,854,422 A | 12/1998 | McKeon et al. |
| 5,862,162 A | 1/1999 | Maeda |
| 5,866,073 A | 2/1999 | Sausa et al. |
| 5,892,617 A | 4/1999 | Wallace |
| 6,089,076 A | 7/2000 | Mueller et al. |
| 6,134,257 A | 10/2000 | Capasso et al. |
| 6,154,307 A | 11/2000 | Veronesi et al. |
| 6,157,033 A | 12/2000 | Chudnovsky |
| 6,192,064 B1 | 2/2001 | Algots et al. |
| 6,243,404 B1 | 6/2001 | Joyce |
| 6,326,646 B1 | 12/2001 | Baillargeon et al. |
| 6,327,896 B1 | 12/2001 | Veronesi et al. |
| 6,363,648 B1 | 4/2002 | Kranich et al. |
| 6,400,744 B1 | 6/2002 | Capasso et al. |
| 6,431,732 B1 | 8/2002 | Brown et al. |
| 6,470,036 B1 | 10/2002 | Bailey et al. |
| 6,483,978 B1 | 11/2002 | Gao et al. |
| 6,553,045 B2 | 4/2003 | Kaspi |
| 6,575,641 B2 | 6/2003 | Yamabayashi et al. |
| 6,578,311 B2 | 6/2003 | Danielson et al. |
| 6,608,847 B2 | 8/2003 | Zhang et al. |
| 6,616,452 B2 | 9/2003 | Clark et al. |
| 6,636,539 B2 | 10/2003 | Martinsen |
| 6,678,429 B2 | 1/2004 | Mossberg et al. |
| 6,690,472 B2 | 2/2004 | Kulp et al. |
| 6,714,564 B1 | 3/2004 | Meyers |
| 6,782,162 B2 | 8/2004 | Fukuzawa et al. |
| 6,803,577 B2 | 10/2004 | Edner et al. |
| 6,823,115 B2 | 11/2004 | Greiner et al. |
| 6,829,417 B2 | 12/2004 | Greiner et al. |
| 6,856,717 B2 | 2/2005 | Kilian |
| 6,859,318 B1 | 2/2005 | Mossberg |
| 6,859,481 B2 | 2/2005 | Zheng |
| 6,866,089 B2 | 3/2005 | Avila |
| 6,879,441 B1 | 4/2005 | Mossberg |
| 6,885,965 B2 | 4/2005 | Butler et al. |
| 6,909,539 B2 | 6/2005 | Korniski et al. |
| 6,961,491 B2 | 11/2005 | Greiner et al. |
| 6,965,464 B2 | 11/2005 | Mossberg |
| 6,965,716 B2 | 11/2005 | Greiner et al. |
| 6,985,656 B2 | 1/2006 | Iazikov et al. |
| 6,987,911 B2 | 1/2006 | Mossberg et al. |
| 6,990,276 B2 | 1/2006 | Brice et al. |
| 6,993,223 B2 | 1/2006 | Greiner et al. |
| 6,995,846 B2 | 2/2006 | Kalayeh et al. |
| 7,009,743 B2 | 3/2006 | Mossberg |
| 7,032,431 B2 | 4/2006 | Baum et al. |
| 7,051,469 B1 | 5/2006 | Pochapsky et al. |
| 7,054,517 B2 | 5/2006 | Mossberg et al. |
| 7,061,022 B1 | 6/2006 | Pham et al. |
| 7,062,128 B2 | 6/2006 | Mossberg |
| 7,063,260 B2 | 6/2006 | Mossberg et al. |
| 7,088,076 B2 | 8/2006 | Densham et al. |
| 7,116,453 B2 | 10/2006 | Mossberg |
| 7,120,334 B1 | 10/2006 | Greiner et al. |
| 7,123,794 B2 | 10/2006 | Greiner et al. |
| 7,151,787 B2 | 12/2006 | Kulp et al. |
| 7,181,103 B1 | 2/2007 | Greiner et al. |
| 7,189,970 B2 | 3/2007 | Racca et al. |
| 7,190,856 B1 | 3/2007 | Iazikov et al. |
| 7,190,858 B1 | 3/2007 | Greiner et al. |
| 7,190,859 B2 | 3/2007 | Greiner et al. |
| 7,194,164 B2 | 3/2007 | Iazikov et al. |
| 7,203,401 B2 | 4/2007 | Mossberg et al. |
| 7,224,855 B2 | 5/2007 | Iazikov et al. |
| 7,224,867 B2 | 5/2007 | Mossberg |
| 7,231,862 B1 | 6/2007 | Quinn |
| 7,260,290 B1 | 8/2007 | Greiner et al. |
| 7,265,842 B2 | 9/2007 | Paldus et al. |

(56) References Cited

U.S. PATENT DOCUMENTS

| | | | |
|---|---|---|---|
| 7,286,732 | B2 | 10/2007 | Greiner et al. |
| 7,292,755 | B1 | 11/2007 | Greiner et al. |
| 7,325,318 | B2 | 2/2008 | Roes |
| 7,325,354 | B2 | 2/2008 | Grauslys et al. |
| 7,327,908 | B1 | 2/2008 | Iazikov et al. |
| 7,330,614 | B1 | 2/2008 | Mossberg et al. |
| 7,333,692 | B1 | 2/2008 | Mossberg et al. |
| 7,341,189 | B2 | 3/2008 | Mossberg et al. |
| 7,345,277 | B2 | 3/2008 | Zhang |
| 7,349,599 | B1 | 3/2008 | Iazikov et al. |
| 7,358,498 | B2 | 4/2008 | Geng et al. |
| 7,359,597 | B1 | 4/2008 | Iazikov et al. |
| 7,424,042 | B2 | 9/2008 | Day et al. |
| 7,429,734 | B1 | 9/2008 | Tidwell |
| 7,466,734 | B1 | 12/2008 | Day et al. |
| 7,490,430 | B2 | 2/2009 | Staley |
| 7,492,806 | B2 | 2/2009 | Day et al. |
| 7,505,119 | B2 | 3/2009 | Rogers |
| 7,535,656 | B2 | 5/2009 | Day et al. |
| 7,535,936 | B2 | 5/2009 | Day et al. |
| 7,559,169 | B2 | 7/2009 | Hung et al. |
| 7,590,316 | B2 | 9/2009 | Dames |
| 7,623,234 | B2 | 11/2009 | Puzey |
| 7,732,767 | B2 | 6/2010 | Houde-Walter |
| 7,733,925 | B2 | 6/2010 | Pushkarsky et al. |
| 7,753,549 | B2 | 7/2010 | Solinsky et al. |
| 7,755,041 | B2 | 7/2010 | Killinger et al. |
| 7,796,341 | B2 | 9/2010 | Day et al. |
| 7,818,911 | B2 | 10/2010 | Houde-Walter |
| 7,826,503 | B2 | 11/2010 | Day et al. |
| 7,848,382 | B2 | 12/2010 | Weida et al. |
| 7,873,094 | B2 | 1/2011 | Day et al. |
| 7,920,608 | B2 | 4/2011 | Marsland, Jr. et al. |
| 8,027,094 | B2 | 9/2011 | Day et al. |
| 8,050,307 | B2 | 11/2011 | Day et al. |
| 9,225,148 | B2 * | 12/2015 | Arnone ............... F41H 13/0056 |
| 2002/0024979 | A1 | 2/2002 | Vilhelmsson et al. |
| 2002/0064198 | A1 | 5/2002 | Koizumi |
| 2002/0075916 | A1 | 6/2002 | Sato et al. |
| 2002/0090013 | A1 | 7/2002 | Murry et al. |
| 2002/0105699 | A1 | 8/2002 | Miracky et al. |
| 2002/0150133 | A1 | 10/2002 | Aikiyo et al. |
| 2002/0176473 | A1 | 11/2002 | Mouradian |
| 2003/0043877 | A1 | 3/2003 | Kaspi |
| 2003/0063633 | A1 | 4/2003 | Zhang et al. |
| 2003/0095346 | A1 | 5/2003 | Nasu et al. |
| 2003/0123495 | A1 | 7/2003 | Cox |
| 2003/0127596 | A1 | 7/2003 | Kosterev et al. |
| 2003/0174315 | A1 | 9/2003 | Byren et al. |
| 2003/0179789 | A1 | 9/2003 | Pilgrim et al. |
| 2003/0198274 | A1 | 10/2003 | Lucchetti |
| 2004/0013154 | A1 | 1/2004 | Zheng |
| 2004/0032891 | A1 | 2/2004 | Ikeda et al. |
| 2004/0095579 | A1 | 5/2004 | Bisson et al. |
| 2004/0165640 | A1 | 8/2004 | Clifford et al. |
| 2004/0208602 | A1 | 10/2004 | Plante |
| 2004/0228371 | A1 | 11/2004 | Kolodzey et al. |
| 2004/0238811 | A1 | 12/2004 | Nakamura et al. |
| 2004/0264523 | A1 | 12/2004 | Posamentier |
| 2005/0083568 | A1 | 4/2005 | Nakae et al. |
| 2005/0105566 | A1 | 5/2005 | Sacher |
| 2005/0199869 | A1 | 9/2005 | Shi |
| 2005/0213627 | A1 | 9/2005 | Masselink et al. |
| 2005/0237524 | A1 | 10/2005 | Kamei |
| 2006/0056466 | A1 | 3/2006 | Belenky et al. |
| 2006/0214107 | A1 | 9/2006 | Mueller |
| 2006/0262316 | A1 | 11/2006 | Baney |
| 2006/0268947 | A1 | 11/2006 | Kalayeh |
| 2007/0019702 | A1 | 1/2007 | Day et al. |
| 2007/0030865 | A1 | 2/2007 | Day et al. |
| 2007/0047599 | A1 | 3/2007 | Wysocki et al. |
| 2007/0209268 | A1 | 9/2007 | Birurakis et al. |
| 2007/0291804 | A1 | 12/2007 | Day et al. |
| 2008/0075153 | A1 | 3/2008 | Day et al. |
| 2008/0231719 | A1 | 9/2008 | Benson |
| 2008/0298406 | A1 | 12/2008 | Day et al. |
| 2008/0304524 | A1 | 12/2008 | Marsland et al. |
| 2009/0015914 | A1 | 1/2009 | Duncan et al. |
| 2009/0159798 | A1 | 6/2009 | Weida et al. |
| 2009/0213882 | A1 | 8/2009 | Weida et al. |
| 2009/0257709 | A1 | 10/2009 | Dames |
| 2009/0262768 | A1 | 10/2009 | Day et al. |
| 2010/0110198 | A1 | 5/2010 | Larson et al. |
| 2010/0132581 | A1 | 6/2010 | Day et al. |
| 2010/0229448 | A1 | 9/2010 | Houde-Walter et al. |
| 2010/0243891 | A1 | 9/2010 | Day et al. |
| 2011/0006229 | A1 | 1/2011 | Day et al. |
| 2011/0080311 | A1 | 4/2011 | Pushkarsky et al. |
| 2011/0222566 | A1 | 9/2011 | Weida et al. |
| 2011/0233409 | A1 | 9/2011 | Weida et al. |

FOREIGN PATENT DOCUMENTS

| | | |
|---|---|---|
| EP | 0883 220 A2 | 12/1998 |
| EP | 2081 265 A3 | 9/2009 |
| GB | 2286901 A | 8/1995 |
| JP | 55087107 A | 7/1980 |
| JP | 58072108 | 4/1983 |
| JP | 03-048480 A | 3/1991 |
| JP | 07-024322 B | 1/1995 |
| JP | 2005317819 A | 11/2005 |
| WO | WO9220127 A1 | 11/1992 |
| WO | WO 03/067720 A2 | 8/2003 |
| WO | WO2008036881 A2 | 3/2008 |
| WO | WO2008036884 A2 | 3/2008 |

OTHER PUBLICATIONS

Lawrence T. Marshall et al., "Integrated Sight,"CECOM RDEC Night Vision and Electronic Sensors Directorate, Fort Belvoir, VA, Texas Instruments, Inc., Plano, TX, Jun. 1997, 8 pages, SPIE vol. 3080, 0277-786X/97, SPIE Digital Library.

T.L. Myers et al., "FY 2005 Quantum Cascade Laser Alignment System Final Report," Dec. 2005, 52 pages, PNNL-15600, Pacific Northwest National Laboratory, prepared for the U.S. Department of Energy.

Joe S. Randella et al., "The Integrated Sight: Future Improvement for Land Warrior,"Aug. 1998, pp. 62-72, Proceedings of the SPIE— SPIE vol. 3394, The International Society for Optical Engineering, SPIE Digital Library.

Jacob B. Khurgin et al., "Transport and gain in a quantum cascade laser model and equivalent circuit," Nov. 2010, 9 pages, Optical Engineering 49(11), 111110, SPIE Nov. 2010/vol. 49 (11), © 2010 SPIE, SPIE Digital Library.

Shunt Switched Current Control. Applicant admits that this circuit design is prior art and used more than one year prior to Aug. 16, 2010.

QC Current Regulator. Applicant admits that this circuit design is prior art and used more than one year prior to Aug. 16, 2010.

Thorlabs, Thorlabs.com-Tunable Lasers:Littrow and Littman Prealigned Kits, OFC Information Sheet 2011, http://www.thorlabs.us/newgrouppage9.cfm?objectgroup_id=4757, © 1999-2011 Thorlabs.

Oleksiy Andrusyak et al., External and common-cavity high spectral density beam combining of high power fiber lasers, Jan. 1, 2008, Proc. of SPIE vol. 6873, SPIE Digital Library.

Thomas Schreiber et al., Incoherent Beam Combining of Continuous-Wave and Pulsed Yb-Doped Fiber Amplifiers, Mar. 1, 2009, vol. 15, No. 2, © 2009 IEEE.

PCT/US2011/028780 filed Mar. 17, 2011, Daylight Solutions, Inc. PCT International Application No. PCT/US2011/028780 and its entire prosecution history.

PCT/US2011/43065 filed Jul. 6, 2011, Daylight Solutions, Inc. PCT International Application No. PCT/US2011/443065 and its entire prosecution history.

U.S. Appl. No. 13/177,332, filed Jul. 6, 2011, Daylight Solutions, Inc. U.S. Appl. No. 13/177,332, filed Jul. 6, 2011 and its entire prosecution history.

U.S. Appl. No. 13/211,186, filed Aug. 16, 2011, Daylight Solutions, Inc. U.S. Appl. No. 13/211,186, filed Aug. 16, 2011 and its entire prosecution history.

(56) References Cited

OTHER PUBLICATIONS

U.S. Appl. No. 13/221,721, filed Aug. 30, 2011, Daylight Solutions, Inc. U.S. Appl. No. 13/221,721, filed Aug. 30, 2011 and its entire prosecution history.
U.S. Appl. No. 13/237,461, filed Sep. 20, 2011, Daylight Solutions, Inc. U.S. Appl. No. 13/237,461, filed Sep. 20, 2011 and its entire prosecution history.
U.S. Appl. No. 13/267,787, filed Oct. 6, 2011, Daylight Solutions, Inc. U.S. Appl. No. 13/267,787, filed Oct. 6, 2011 and its entire prosecution history.
U.S. Appl. No. 13/303,088, filed Nov. 22, 2011, Daylight Solutions, Inc. U.S. Appl. No. 13/303,088, filed Nov. 22, 2011 and its entire prosecution history.
Hildebrandt, L. et al . . . "Quantum cascade external cavity laser systems in the mid-infrared spectral range," 2004, Sacher Lasertechnik Group, Marburg, Germany.
Haim Lotem, Mode-hop suppression of Littrow grating-tuned lasers: comment, 20 Month 1994, p. 1, vol. 33, No. 00, Applied Optics.
Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, © 1985 Optical Society of America.
Corrie David Farmer, "Fab and Eval. of QCL's", Sep. 2000, Faculty of Engineering, University of Glasgow, Glasgow, UK.
M. De Labachelerie and G. Passedat, Mode-hop suppression of Littrow grating-tuned lasers, Jan. 20, 1993, pp. 269-274, vol. 32, No. 3, Applied Optics, © 1993 Optical Society of America.
S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland.
Gaetano Scamarcio, Mid-IR and THz Quantum Cascade Lasers, 2005, Physics Dept., University of Bari, Bari Italy.
Gaetano Scamarcio et al., Micro-probe characterization of QCLs correlation with optical performance, APL 78, 1177 & APL 78, 2095 (2001), APL 2002, APL 2004, University of Bari, Bari Italy.
J. Faist, THz and Mid-IR Quantum cascade lasers, QM in space, Chatillon, Mar. 31, Science 2002, University of Neuchatel, EU Projects ANSWER/TERANOVA; Agilent, Funding Swiss National Science Foundation.
Joel M. Hensley, Recent Updates in QCL-based Sensing Applications, Sep. 5-10, 2006, Physical Sciences, Inc., Andover, MA, 2nd International Workshop on Quantum Cascade Lasers, Ostuni, Italy.
J.M. Hensley et al., Demonstration of an External Cavity Terahertz Quantum Cascade Laser, Copyright 2005, Optical Society of America, Washington, DC 20036.
L. Hildebrandt et al., Quantum cascade external cavity and DFB laser systems in the mid-infrared spectral range: devices and applications, 2004, Marburg Germany.
Richard Maulini et al., Broadly tunable external cavity quantum-cascade lasers, 2005, University of Neuchatel, Neuchatel Switzerland.
Tsekoun, A. et al; "Improved performance of QCL's through a scalable, manufacturable epitaxial-side-down mounting process"; Feb. 2006.
Pushkarsky, M. et al.; "Sub-parts-per-billion level detection of NO2 using room temp. QCLs"; May 2006.
Wirtz, D. et al.; "A tuneable heterodyne infrared spectrometer"; Physikalisches Institut; University of Koln; Koln Germany Spectrochimica 2002.
Williams, B. et al.;"Terahertz QCLs and Electronics"; PhD-MIT 2003.
Weida et al., Utilizing broad gain bandwidth in quantum cascade devices, Nov. 2010, vol. 49 (11) Optical Engineering , 111120, 0091-3286/2010 © 2010 SPIE.
File:LED, 5mm, green (en).svg-Wikipedia, the free encyclopedia, Description English: A labeled drawing of a 5mm round (the "normal" type) LED. Apr. 6, 2009, 3 pages, http://en.wikipedia.org/wiki/File:LED,_5mm,_green(en).svg.

Martini, Ranier et al.,"High duty cycle operation of quantum cascade lasers based on graded superlattice active regions,"Journal of Applied Physics, Jun. 15, 2001, pp. 7735-7738,vol. 89, No. 12, XP012052642 ISSN:0021-8979, © 2001 American Institute of Physics.
Sitori, Carlo et al., "Mid-Infrared (8.5 µm) Semiconductor Lasers Operating at Room Temperature," IEEE Photonics Technology Letters, Mar. 1997, pp. 297-299, vol. 9, No. 3, XP000684396, ISSN:1041-1135, © 1997 IEE.
W. Y. Oh et al, "115 kHz tuning repetition rate ultrahigh-speed wavelength-swept semiconductor laser", received Apr. 11, 2005, accepted Aug. 9, 2005, pp. 3159-3163, vol. 30, No. 23, Optics Letters, © 2005 Optical Society of America.
Weida et al.,"Tunable QC laser opens up mid-IR sensing applications," Jul. 2006, pp. 1-5, Laser Focus World, http://www.optoiq.com/index/photonics-technologies-applications/lfw-display/lfw-articles-tools-template/_pr . . . .
G.P. Luo et al.,Grating-tuned external-cavity quantum-cascade semiconductor lasers, May 7, 2001, Applied Physics Letters, vol. 78, No. 19, © 2001 American Institute of Physics.
G. Wysocki et al.,Widely tunable mode-hop free external cavity quantum cascade laser for high resolution spectroscopic applications, Jul. 27, 2005, Applied Physics, B81, pp. 769-777, Applied Physics B Lasers and Optics.
Day et al., Miniaturized External Cavity Quantum Cascade Lasers for Broad Tunability in the Mid-Infrared, May 21, 2006, 1-55752-813-6, Lasers and Electro-Optics and 2006 Quantum Electronics and Laser Science Conference, © 2006 IEEE.
G. Totschig et al.,Mid-infrared external-cavity quantum-cascade laser XP-001161786, Oct. 15, 2002, pp. 1788-1790, Optics Letters/vol. 27, No. 20, © 2002 Optical Society of America.
Thierry Aellen et al., Continuous-wave distributed-feedback quantum-cascade lasers on a Peltier cooler, Sep. 8, 2003, pp. 1929-1931, Applied Physics Letters, vol. 83, No. 10, © 2003 American Institute of Physics.
D. Weidmann et al., Development of a compact quantum cascade laser spectrometer for field measurements of CO 2 isotopes, Feb. 1, 2005, pp. 255-260, Applied PhysicsB, Lasers and Optics, Appl. Phys. B 80, published online: Sep. 29, 2004 © Springer-Verlag 2004.
Cassidy et al., Short-external-cavity module for enhanced single-mode tuning of InGaAsP and AlGaAs semiconductor diode lasers, Oct. 1991, No. 10, pp. 2385-2388, © 1991 American Institute of Physics.
M.G. Littman, H.J. Metcalf: "Spectrally narrow pulse dye laser without beam expander" Applied Optics, vol. 17, No. 14, Jul. 15, 1978, pp. 2224-2227, XP002528173 US.
Victor Rudometov and Eugene Rudometrov, Peltier Coolers, May 11, 2005, pp. 1-11, http://www.digit-life.com/article/peltiercoolers.com/ © Digit-Life.com 1997-2004.
T Topfer, KP Petrov, Y Mine, D Jundt, RF Curl, and FK Tittel, Room-temperature mid-infrared laser sensor for trace gas detection, Applied Optics, Oct. 20, 1997, pp. 8042-8049, vol. 36 No. 30, Oct. 20, 1997/Applied Optics.
Cavity Enhancing Sensors using QC Lasers, Jun. 7, 2005, pp. 1-6, http://www.infrared.phl.gov/enhanced.sensors.html, Webmaster: Pamela Kinsey, Reviewed: Nov. 23, 2004.
Transient FM Absorption Spectroscopy, Jun. 7, 2005, pp. 1 and 2, http://www.chem/tamu.edu/group/north/FM.html.
FM Spectoscopy With Tunable Diode Lasers, Application Note 7, pp. 1-10, New Focus Copyright 2001.
John Andrews and Paul Dalin,Frequency Modulation Spectroscopy, Dec. 2005, pp. 24-26, http://www.spectroscopyeurope.com.
R.F. Curl and F.K. Tittel,Tunable infrared laser spectroscopy, 1998, pp. 219-272, Annu. Rep. Prog-Chem. Sect. C, 2002.
Shawn Wehe et al., AIAA 2002-0824 Measurements of Trace Pollutants in Combustion Flows Using Room-Temperature, Mid-IR Quantum Cascade Lasers , S. Wehe, et al. (Physical Sciences, Inc.) C Gmachi and F Capasso (Bell Lab., Lucent Technologies), Jan. 2002, cover and pp. 1-7, 40th AIAA Aerospace Sciences Meeting and Exhibit 14,Jan. 17, 2002, Reno, NV.

(56) References Cited

OTHER PUBLICATIONS

W. Huang, RRA Syms, J. Stagg and A.A. Lohmann, Precision MEMS Flexure mount for a Littman tunable external cavity laser, Mar. 2004, pp. 67-75, IEE Prc-Sci Meas. Technol vol. 151, No. 2 Mar. 2004.

K. Namjou, S. Cai, E.A. Whitaker, J. Faist, C. Gmacahi, F. Capasso, D.L. Sivco and A.Y. Cho,Sensitive absorption spectroscopy with a room-temperature distributed-feedback quantum-cascade laser, 1998, pp. 219-221, 1998 Optical Society of America.

Gregory E. Hall and Simon W. North,Transient Laser Frequency Modulation Spectroscopy, 2000, pp. 243-274, Annu. Rev.Phys. Chem. 2000.51:243-74—Copyright 2000.

External-cavity quantum-cascade lasers, May 11, 2005, pp. 1-4, http://www.unine.ch/phys/meso/EC/EC.html.

Frequency stabilization of diode lasers, May 30, 2005, pp. 1-17, Santa Chawla—National Physical Laboratory, http://www.ias.ac.in/currsci/jan25/articles41.htm, National Physical Lab, New Delhi 110 012 India.

R.A. Syms, A. Lohmann, MOEMS Tuning Element for a Littrow External Cavity Laser, Dec. 2003, pp. 921-928, Journal of Microelectromechanical Systems, vol. 12, No. 6 Dec. 2003.

A.A. Koserev et al., Thermoelectrically cooled quantum cascade laser based sensor for continuous monitoring of ambient atmospheric CO—AA Koserev, FK Tittel, R Kohler, C Gmachi, F Capasso, DL Sivco, AY Cho, S Wehe and M Allen, 2002, cover and pp. 1-16, Copyright 2002 Optical Society of America (provided in parent U.S. Appl. No. 11/154,264).

Cooke, M., Producing more light than heat from quantum cascade lasers, published on-line Jan. 10, 2010, www.semiconductor-today.com, Semiconductor Today, vol. 5, Issue 1, pp. 106-107, Feb. 2010.

Lincoln Laboratory, News, MIT Lincoln Laboratory creates bright diode lasers, posted on-line Oct. 2009, pp. 1-2, MIT Lincoln Laboratory:News: MIT Lincoln Laboratory creates bright diode lasers, © 2011 Lincoln Laboratory, Massachusetts Institute of Technology.

Lincoln Laboratory, Publications, Lab Notes, Laser Technology, A Bright Idea, Simple tweaks turn into tiny diode lasers into powerhouses, posted on-line Jun. 2010, pp. 1-3, MIT Lincoln Laboratory:Lab Note: A Bright Idea, © 2011 Lincoln Laboratory, Massachusetts Institute of Technology.

Michael Hacskaylo, "Laser Aiming Light," Army Electronics Command Fort Belvoir, VA Night Vision Lab, Jan. 1974, 26 pages, US Department of Commerce, Technology Administration, National Technical Information Service, Springfield, VA 22161.

* cited by examiner

LASER SOURCE ASSEMBLY WITH THERMAL CONTROL AND MECHANICALLY STABLE MOUNTING

RELATED INVENTION

This application is a continuation application of U.S. application Ser. No. 13/240,889, filed Sep. 22, 2011 and entitled "LASER SOURCE ASSEMBLY WITH THERMAL CONTROL AND MECHANICALLY STABLE MOUNTING". U.S. application Ser. No. 13/240,889 claims priority on U.S. Provisional Application Ser. No. 61/385,864, filed Sep. 23, 2010 and entitled "LASER SOURCE ASSEMBLY WITH THERMAL CONTROL AND MECHANICALLY STABLE MOUNTING". As far as permitted, the contents of U.S. Provisional Application Ser. No. 61/385,864 and U.S. application Ser. No. 13/240,889 are incorporated herein by reference.

BACKGROUND

Anti-aircraft missiles can be used to attack and destroy target aircraft, while not requiring the attackers to get too close to the intended target. Moreover, anti-aircraft missiles typically include a guidance system that enables the anti-aircraft missile to become locked onto the target aircraft despite attempted evasive maneuvers by the target aircraft. Thus, the party being attacked needs to develop means by which they can evade and/or disable the anti-aircraft missiles. One means for disabling the anti-aircraft missiles is to develop reliable and cost-effective means to jam or otherwise disable the guidance system of the anti-aircraft missile. For example, the party being attacked can utilize a precisely generated and directed laser beam from a laser source to jam or otherwise disable the guidance system of the anti-aircraft missile.

During use, the laser source can be positioned on a mounting frame that supports the laser source and additional elements of a laser system. Unfortunately, the use of lasers can often generate substantial heat, which heats up the mounting frame as well as the laser source, and which may affect the precision of the generated laser beam. Accordingly, it is necessary to remove heat from the laser source and the mounting frame to improve the precision of the laser beam. Additionally, it is desired to allow for some limited expansion and/or contraction of the mounting frame and/or the laser source during use due to temperature and pressure changes without otherwise compromising the precision of the generated laser beams.

SUMMARY

The present invention is directed toward a laser source that generates an output beam that is directed along a beam axis that is coaxial with a first axis and orthogonal to a second axis. In certain embodiments, the laser source comprises a first frame, a laser, and a first mounting assembly. The laser is adapted to generate the output beam that is directed along the beam axis. The first mounting assembly couples the laser to the first frame. Additionally, the first mounting assembly allows the laser to expand and contract relative to the first frame along the first axis and along the second axis, while maintaining alignment of the output beam so the beam axis is substantially coaxial with the first axis.

Additionally, in some embodiments, the first mounting assembly includes a first fastener assembly that couples the laser to the first frame, and a first alignment assembly that maintains alignment of the laser along a first alignment axis that is substantially parallel to the first axis.

In one such embodiment, the first fastener assembly includes a plurality of fasteners, with each fastener being adapted to fit within an oversized frame aperture in the first frame.

In another such embodiment, the laser includes a second frame, and the first fastener assembly allows the second frame to expand and contract relative to the first frame along the first axis and along the second axis, while maintaining the approximate position of the second frame relative to the first frame along a third axis that is orthogonal to the first and second axes. Further, the first fastener assembly can thermally and electrically isolate the second frame from the first frame. In one embodiment, the second frame includes a groove, and the first fastener assembly includes an engagement rod that fits into the groove and a resilient assembly that urges the engagement rod into the groove to urge the second frame toward the first frame. Additionally, an interface between the resilient assembly and the engagement rod forms a line contact between the resilient assembly and the engagement rod that inhibits heat from being transferred between the second frame and the first frame. With this design, thermal isolation is provided between the second frame and the first frame. Moreover, in one embodiment, the engagement rod is made of an electrically insulating material to provide electrical isolation between the second frame and the first frame.

In some embodiments, the first alignment assembly includes a first alignment pin that fits snugly within a first frame aperture in the first frame, and a second alignment pin that fits into a first frame slot in the first frame. In such embodiments, the first frame slot extends along the first alignment axis, and the alignment pins and the first frame aperture are aligned along the first alignment axis.

Additionally, in certain embodiments, the laser source further comprises a second mounting assembly that couples the laser to a second frame. In such embodiments, the second mounting assembly allows the laser to expand and contract relative to the second frame along the first axis and along the second axis, while maintaining alignment of the output beam so the beam axis is substantially coaxial with the first axis. In one embodiment, the first mounting assembly secures the laser to the first frame, and the second mounting assembly secures the first frame to the second frame. Moreover, in one embodiment, the first mounting assembly includes a first alignment assembly that maintains alignment of the laser along a first alignment axis that is substantially parallel to the first axis, and the second mounting assembly includes a second alignment assembly that maintains alignment of the first frame along a second alignment axis that is substantially aligned with the first alignment axis.

Further, in one embodiment, the first frame can include a frame window. The output beam exits the first frame through the frame window. In such embodiment, the first mounting assembly maintains the approximate position of the frame window along the first axis, along the second axis, and along a third axis that is orthogonal to the first and second axes.

In some embodiments, the laser is a quantum cascade laser. In one such embodiment, the laser includes a laser frame, a quantum cascade gain medium, and a temperature controller that controls the temperature of the laser frame and the quantum cascade gain medium. In such embodiment, the laser frame transfers heat away from the quantum cascade gain medium to the temperature controller.

The present invention is further directed toward a laser system including a first laser source that generates a first output beam, the laser source as described above that generates a second output beam, and a beam combiner that combines the first output beam and the second output beam into an assembly output beam. Moreover, the present invention is also directed toward a laser source assembly including a mounting frame, and the laser system as described above that is secured to the mounting frame.

Still further, the present invention is directed toward a method for directing an output beam along a beam axis that is coaxial with a first axis and orthogonal to a second axis.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
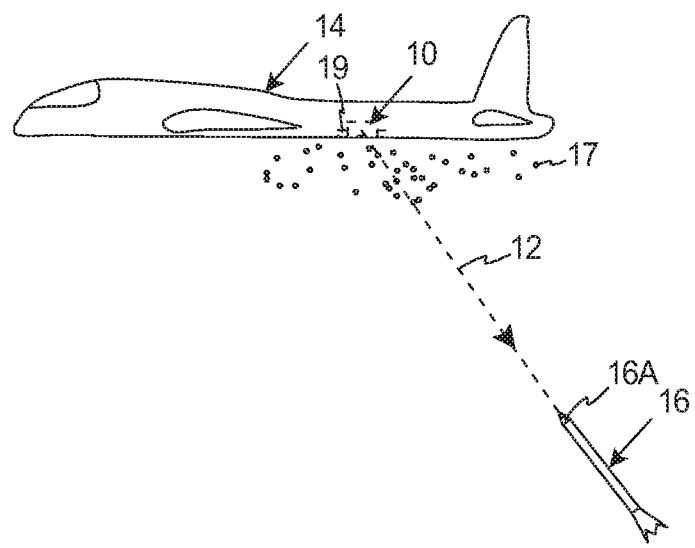
FIG. 1 is simplified side view of a laser source assembly having features of the present invention that generates an assembly output beam.

FIG. 1 is simplified side illustration of a laser source assembly 10 (illustrated in phantom) having features of the present invention that generates an assembly output beam 12 (illustrated with a dashed arrow line). There are a number of possible usages for the laser source assembly 10 disclosed herein. For example, as illustrated in FIG. 1, the laser source assembly 10 can be used on an aircraft 14 (e.g., a plane or helicopter) to protect the aircraft 14 from a heat seeking missile 16. In this embodiment, the missile 16 is locked onto the heat emitting from the aircraft 14, and the laser source assembly 10 emits the assembly output beam 12 that protects the aircraft 14 from the missile 16. For example, the assembly output beam 12 can be directed at the missile 16 to jam a guidance system 16A (illustrated as a box in phantom) of the missile 16. In this embodiment, the laser source assembly 10 functions as a jammer of an anti-aircraft missile.

Alternatively, for example, the laser source assembly 10 can be used for a free space communication system in which the laser source assembly 10 is operated in conjunction with an IR detector located far away, to establish a wireless, directed, invisible data link. Still alternatively, the laser source assembly 10 can be used for any application requiring transmittance of directed infrared radiation through the atmosphere at the distance of thousands of meters, to simulate a thermal source to test IR imaging equipment, as an active illuminator to assist imaging equipment, or any other application.

Figure 2A:
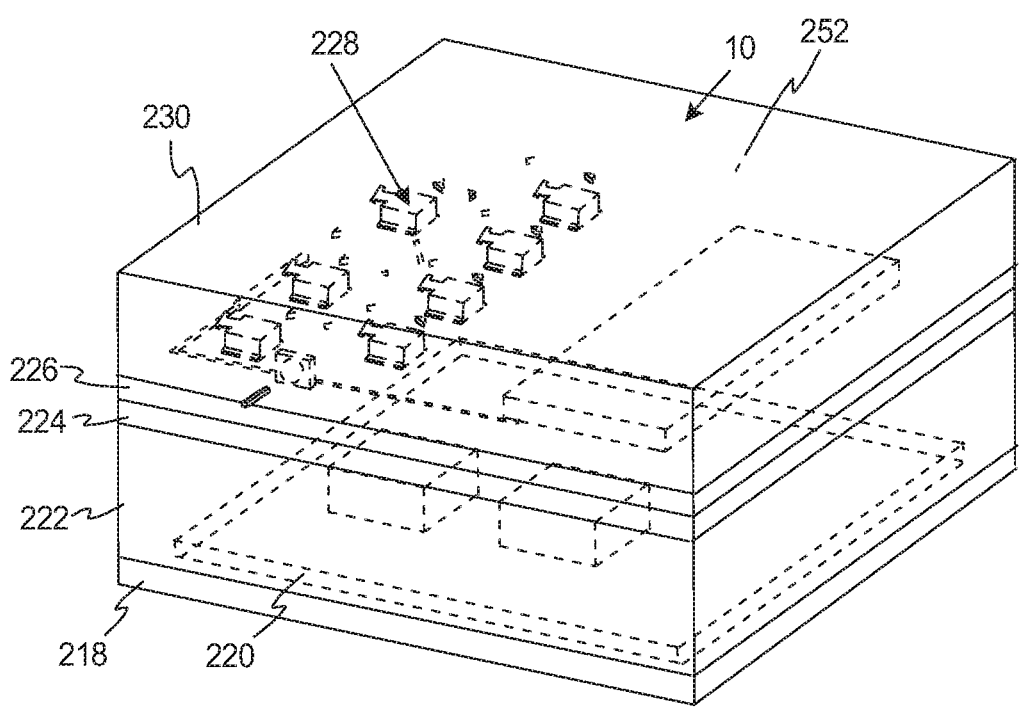
FIG. 2A is a simplified perspective view of an embodiment of the laser source assembly illustrated in FIG. 1.
Figure 2B:
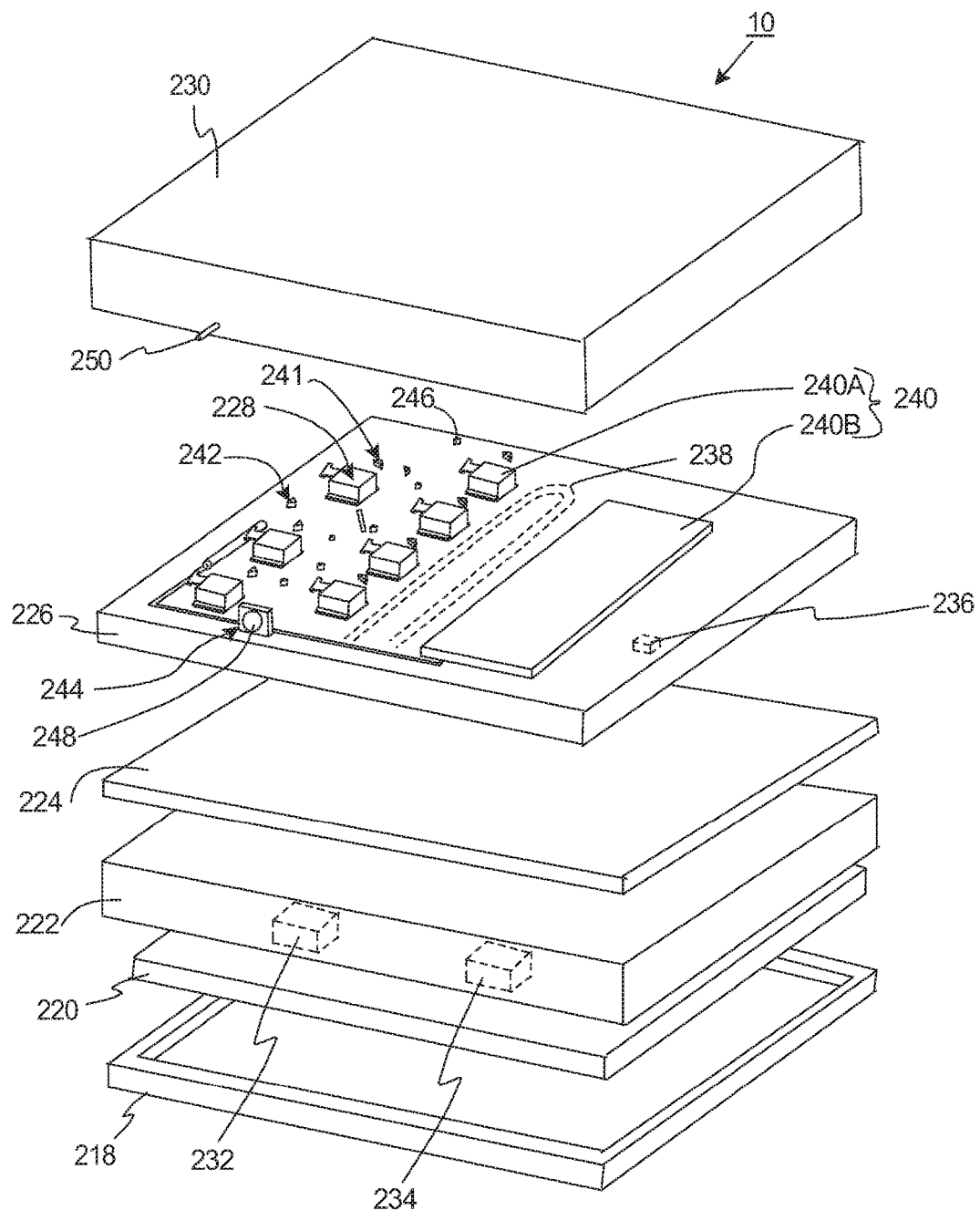
FIG. 2B is a simplified, partially exploded perspective view of the laser source assembly illustrated in FIG. 2A.
Figure 3:
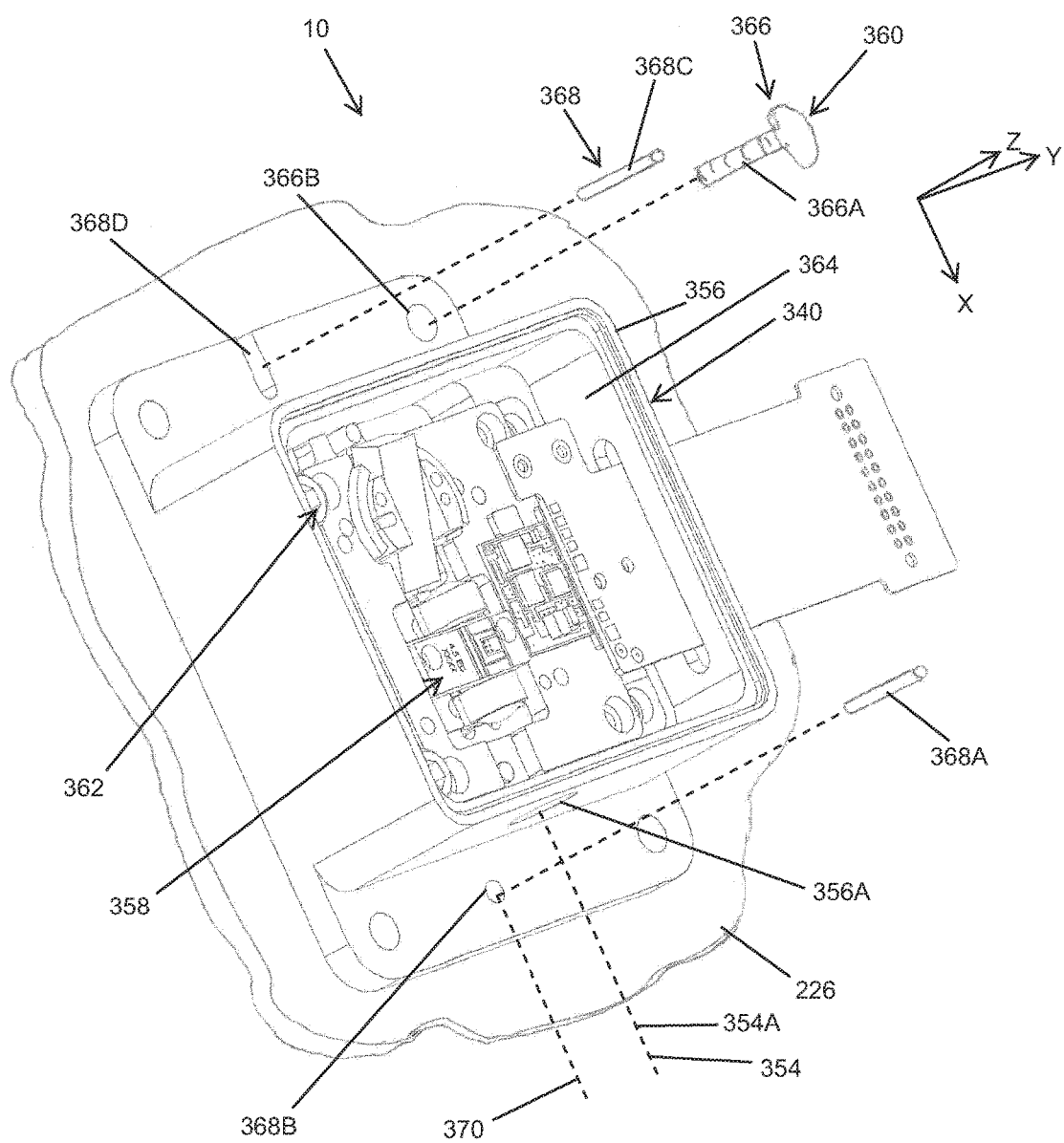
FIG. 3 is a partially exploded top perspective view of a portion of the laser source assembly illustrated in FIG. 2A, the laser source assembly including a mounting frame and a laser source that is mounted on the mounting frame.

As an overview, in certain embodiments, the laser source assembly 10 includes a plurality of spaced apart, individual laser sources 240 (illustrated in FIG. 2B) that are secured to a mounting frame 226 (illustrated in FIG. 2A), with one or more of the laser sources 240 including a housing frame 356 (illustrated in FIG. 3), a laser 358 (illustrated in FIG. 3), a housing mounting assembly 360 (illustrated in FIG. 3), and a laser mounting assembly 362 (illustrated in FIG. 3). In certain embodiments, the housing mounting assembly 360 is designed to secure the housing frame 356 to the mounting frame 226 in a unique fashion that allows the housing frame 356 to expand and contract relative to the mounting frame 226 (due to changes in temperature) while not distorting the housing frame 356 and the laser 358, and while maintaining alignment of an output beam 354 (illustrated in FIG. 3) of the laser source 240. Moreover, in certain embodiments, the laser mounting assembly 362 is designed to secure the laser 358, including a laser frame 478 (illustrated in FIG. 4A) of the laser 358, to the housing frame 356 in a unique fashion (i) that allows the laser 358, including the laser frame 478, to expand and contract relative to the housing frame 356 (due to changes in temperature) while not distorting the laser 358, and while maintaining alignment of the output beam 354, and (ii) that thermally and electrically isolates the laser 358 from the housing frame 356.

It should be noted that the mounting frame 226, the housing frame 356, and the laser frame 478 can be referred to alternatively as the first frame, the second frame, and the third frame, with any of the mounting frame 226, the housing frame 356 and/or the laser frame 478 being referred to as any of the first frame, the second frame and/or the third frame.

Additionally, it should be noted that the housing mounting assembly 360 and the laser mounting assembly 362 can be referred to individually and/or collectively as the "mounting assembly". Thus, with the design as illustrated and described herein, the mounting assembly 360, 362 couples and/or secures the laser 358 to the mounting frame 226, and allows the laser 358 to expand and contract relative to the mounting frame 226 (due to changes in temperature), while not distorting the laser 358, and while maintaining alignment of the output beam 354.

In alternative such embodiments, the plurality of laser sources 240 can include a plurality of mid-infrared ("MIR") laser sources 240A (illustrated in FIG. 2B) and/or one or more non-MIR laser sources 240B (illustrated in FIG. 2B), which can be packaged in a portable common module. Each of the laser sources 240 generates a narrow linewidth, accurately settable beam, i.e. the MIR laser sources 240A generate a narrow linewidth, accurately settable MIR beam, i.e. the output beam 354, and/or the non-MIR laser sources 240B generate a narrow linewidth, accurately settable non-MIR beam (not illustrated), and the beams 354 are then combined to create the assembly output beam 12. Further, each of the laser sources 240 can be a single emitter infrared semiconductor laser. As a result thereof, utilizing multiple single emitter infrared semiconductor lasers, the laser source assembly 10 can generate a multiple watt, assembly output beam 12. The exact wavelength of the MIR beams 354 and/or the non-MIR beams that effectively jams the guidance system 16A is uncertain and/or can vary depending on the specifications of the missile 16 and the guidance system 16A. However, with the present invention, the laser sources 240 can be accurately tuned to the appropriate wavelength for jamming the guidance system 16A.

Another important aspect of the beams 354 is the ability propagate through the atmosphere 17 (illustrated as small circles) with minimal absorption. Typically, absorption in the atmosphere 17 is primarily due to the presence of water and carbon dioxide in the atmosphere 17. Atmospheric propagation requires narrow linewidth and accurate settable wavelength to avoid absorption. With the present invention, each of the laser sources 240 generates a narrow linewidth beam 354 and each of the laser sources 240 can be individually tuned so that each beam 354 is at a wavelength that allows for maximum transmission through the atmosphere 17. Stated in another fashion, the wavelength of each beam 354 is specifically selected to avoid the wavelengths that are readily absorbed by water or carbon dioxide.

It should be noted that in certain alternative uses for the laser source assembly 10 as described herein, e.g., in spectroscopy, imaging, and other applications, the ability to specifically select the particular wavelength of each beam 354 also provides various benefits.

Further, in one embodiment, the laser source assembly 10 can include one or more vibration isolators 19 that isolate the components of the laser source assembly 10 from vibration.

A number of the Figures include an orientation system that illustrates an X axis, a Y axis that is orthogonal to the X axis, and a Z axis that is orthogonal to the X and Y axes. It should be noted that these axes can also be referred to as the first, second and third axes. Additionally, the labeling of the orientation system is merely for purposes of reference and the orientation system as provided in the Figures is not intended to define the specific X, Y and Z axes. Rather the X axis as utilized and/or described herein can be any axis that is parallel to the X axis on the orientation system, the Y axis as utilized and/or described herein can be any axis that is parallel to the Y axis on the orientation system, and the Z axis as utilized and/or described herein can be any axis that is parallel to the Z axis on the orientation system.

FIG. 2A is a simplified perspective view of an embodiment of the laser source assembly 10 illustrated in FIG. 1. The design, size and shape of the laser source assembly 10 can be varied pursuant to the teachings provided herein. In FIG. 2A, the laser source assembly 10 is generally rectangular box shaped and includes a bottom cover 218, a system controller 220 (illustrated in phantom) that is stacked on the bottom cover 218, a thermal module 222 that is stacked on the system controller 220, a conductor 224 that is stacked on top of the thermal module 222, a mounting frame 226 that is stacked on top of the conductor 224, a laser system 228 that is secured to the mounting frame 226, and a cover 230 that covers the laser system 228. Alternatively, the laser source assembly 10 can be designed with more or fewer components than are illustrated in FIG. 2A and/or the arrangement of these components can be different than that illustrated in FIG. 2A. For example, in some embodiments, the laser source assembly 10 can be designed without the thermal module 222 and/or without the conductor 224. Further, the size and shape of these components can be different than that illustrated in FIG. 2A.

It should be noted that the laser source assembly 10 can be powered by a generator, e.g., the generator for the aircraft 14 (illustrated in FIG. 1), a battery, or another power source.

FIG. 2B is a simplified, partially exploded perspective view of the laser source assembly 10 illustrated in FIG. 2A. In this embodiment, the bottom cover 218 is rigid, and is shaped somewhat similar to an inverted top to a box. Alternatively, the bottom cover 218 can have another suitable configuration. Additionally, the bottom cover 218 can include one or more vents (not shown) for venting some of the components of the laser source assembly 10.

The system controller 220 controls the operation of the thermal module 222 and the laser system 228. For example, the system controller 220 can include one or more processors and circuits. In certain embodiments, the system controller 220 can control the electron injection current that is directed to the individual laser sources 240 of the laser system 228. Additionally, in certain embodiments, the system controller 220 can control the operation of the thermal module 222 so as to control the temperature of the mounting frame 226 and the laser system 228. With this design, the system controller 220 enables the user to remotely change the characteristics of the assembly output beam 12 (illustrated in FIG. 1).

The thermal module 222 controls at least a portion of the temperature of the mounting frame 226 and the laser system 228. More particularly, the thermal module 222 cooperates with the temperature controller 484 (illustrated in FIG. 4A) to control the temperature of the mounting frame 226 and the laser system 228. For example, as shown in FIG. 2B, the thermal module 222 can include a heater 232 (illustrated in phantom) and a chiller 234 (illustrated in phantom) to selectively adjust the temperature of the mounting frame 226 and/or the laser system 228 as necessary. Additionally, the thermal module 222 can utilize a temperature sensor 236 (illustrated in phantom), e.g., a thermistor, to sense the temperature of the mounting frame 226 and/or the laser system 228. In one embodiment, the temperature sensor 236 is positioned on and/or adjacent to the mounting frame 226, and the temperature sensor 236 provides feedback regarding the temperature of the mounting frame 226. The system controller 220 receives the feedback from the temperature sensor 236 to control the operation of the thermal module 222. With this design, the thermal module 222 is used to directly control the temperature of the mounting frame 226 so that the mounting frame 226 is maintained at a predetermined temperature. In one non-exclusive embodiment, the predetermined temperature is approximately 25 degrees Celsius. By maintaining the mounting frame 226 at a predetermined temperature, the thermal module 222 can be used to effectively control the temperature of the components of the laser system 228.

In one embodiment, the thermal module 222 is designed to selectively circulate hot or cold circulation fluid (not shown) through the mounting frame 226 to control the temperature of the mounting frame 226, i.e. to maintain the mounting frame 226 at the predetermined temperature. In the embodiment illustrated in FIG. 2B, the heater 232 and the chiller 234 are used to control the temperature of the circulation fluid that is circulated through the mounting frame 226. Alternatively, the thermal module 222 can be in direct thermal contact with the mounting frame 226.

Additionally, or alternatively, the thermal module 222 can also include one or more cooling fans and vents to further remove the heat generated by the operation of the laser source assembly 10.

The conductor 224 is positioned between the mounting frame 226 and the thermal module 222. Moreover, the conductor 224 provides thermal isolation between the thermal module 222 and the mounting frame 226, while allowing the thermal module 222 to circulate the circulation fluid through the mounting frame 226.

The mounting frame 226 provides a rigid, one piece platform to support the various components of the laser system 228 and to maintain the relative position of the various components of the laser system 228. In one non-exclusive embodiment, the mounting frame 226 is monolithic, and generally rectangular plate shaped. Alternatively, the mounting frame 226 can have a different design and/or a different shape.

Further, as illustrated, the mounting frame 226 can include a plurality of embedded frame passageways 238 (only a portion of which is illustrated in phantom) that allow for the circulation of the hot and/or cold circulation fluid through the mounting frame 226 to maintain the temperature of the mounting frame 226 and the components of the laser system 228 that are mounted thereon. The mounting frame 226 can also be referred to as a cold plate.

Non-exclusive examples of suitable materials for the mounting frame 226 include magnesium, aluminum, and carbon fiber composite.

The laser system 228 generates the assembly output beam 12 (illustrated in FIG. 1). The design of the laser system 228 and the components used therein can be varied pursuant to the teachings provided herein. In one embodiment, the laser system 228 includes the plurality of spaced apart, individual laser sources 240, and a beam combiner 241.

As provided herein, each of the laser sources 240 can be secured to the mounting frame 226 in a manner such that the housing frame 356 (illustrated in FIG. 3) of the laser source 240 is allowed to expand and contract relative to the mounting frame 226 due to changes in temperature. As noted above, the plurality of laser sources 240 can include a plurality of MIR laser sources 240A and/or the plurality of laser sources 240 can include one or more non-MIR laser sources 240B. Additionally, each of the laser sources 240 generates a beam, i.e. the MIR laser sources 240A generate an MIR beam, i.e. the output beam 354 (illustrated in FIG. 3), and/or the non-MIR laser sources 240B generate a non-MIR beam (not illustrated).

Each of the MIR laser sources 240A can be individually tuned so that a specific wavelength of the output beam 354 of one or more of the MIR laser sources 240A is the same or different than that of the other output beams 354. Thus, the MIR laser sources 240A can be tuned so that the portion of the assembly output beam 12 generated by the MIR laser sources 240A is primarily a single wavelength beam or is primarily a multiple wavelength (incoherent) beam. In one non-exclusive example, each of the MIR laser sources 240A can be tuned so that each output beam 354 has a center wavelength of approximately 4.6 µm. Alternatively, one or more of the MIR laser sources 240A can be tuned such that its output beam 354 has a center wavelength within the MIR range that is greater than or less than 4.6 µm.

Additionally, in one embodiment, the non-MIR laser source 240B can be tuned so that the non-MIR beam can have a center wavelength of approximately 2.0 µm. Alternatively, the non-MIR laser source 240B can be tuned so that the non-MIR beam has a center wavelength outside the MIR range that is greater than or less than 2.0 µm.

As noted above, the exact wavelength of the MIR beams, i.e. the output beams 354, and the non-MIR beam can be selected so that the resulting assembly output beam 12 propagates through the atmosphere 17 (illustrated in FIG. 1) with minimal absorption.

The beam combiner 241 combines the beams 354 that are generated from each of the laser sources 240. More particularly, the beam combiner 241 combines the MIR beams 354 from each of the MIR laser sources 240A and the non-MIR beam from the non-MIR laser source 240B. The design of the beam combiner 241 can be varied. In the embodiment illustrated in FIG. 2B, the beam combiner 241 includes a beam director assembly 242 that is fixedly secured to the mounting frame 226, and a beam focus assembly 244. Alternatively, the beam combiner 241 can be designed without the beam focus assembly 244.

The beam director assembly 242 directs and steers the beams, i.e. the MIR beams 354 and the non-MIR beam, at the beam focus assembly 244. For example, in one embodiment, the beam director assembly 242 can include a plurality of beam directors 246 (e.g., mirror mounts and/or dichroic filters) that are secured to the mounting frame 226. The beam directors 246 cooperate to steer the beams 354 toward the beam focus assembly 244.

The beam focus assembly 244 spatially combines and optically multiplexes the beams, i.e. the MIR beams 354 and the non-MIR beam, to provide the assembly output beam 12. In one embodiment, the beam focus assembly 244 includes a combiner lens 248 and an output optical fiber 250. The design of the combiner lens 248 and the output optical fiber 250 can vary pursuant to the teachings provided herein.

In one embodiment, the combiner lens 248 focuses the beams 354 onto the output optical fiber 250 to spatially combine the beams 354 into the assembly output beam 12. Additionally, as illustrated in FIG. 2B, the output optical fiber 250 can extend through a hole (not illustrated) in the cover 230 of the laser source assembly 10.

A more detailed description of a high output mid infrared laser source assembly can be found in U.S. application Ser. No. 12/427,364, filed on Apr. 21, 2009, and entitled "High Output, Mid Infrared Laser Source Assembly". As far as is permitted, the contents of U.S. application Ser. No. 12/427,364 are incorporated herein by reference.

The cover 230 covers the laser system 228 and provides a controlled environment for the laser system 228. More specifically, the cover 230 can cooperate with the mounting frame 226 to define a sealed laser chamber 252 (illustrated in FIG. 2A) that encloses the laser sources 240. Further, an environment in the sealed laser chamber 252 can be controlled. For example, the sealed laser chamber 252 can be filled with an inert gas, or another type of fluid, or the sealed laser chamber 252 can be subjected to vacuum. In one embodiment, the cover 230 is rigid, and is shaped somewhat similar to a top to a box.

FIG. 3 is a partially exploded top perspective view of a portion of the laser source assembly 10 illustrated in FIG. 2A. More particularly, FIG. 3 illustrates a portion of the mounting frame 226 and an embodiment of a laser source 340 having features of the present invention.

As provided above, the mounting frame 226 provides a rigid, one piece platform for supporting the various components of the laser system 228 (illustrated in FIG. 2A) and for maintaining the relative position of the various components of the laser system 228.

In this embodiment, the laser source 340 is a MIR laser source (e.g. a single emitter infrared semiconductor laser) that generates a narrow linewidth, accurately settable output beam 354 that has a center wavelength in the MIR range.

In the embodiment illustrated in FIG. 3, the laser source 340 includes the housing frame 356, the laser 358, the housing mounting assembly 360, and the laser mounting assembly 362. As noted above, the housing mounting assembly 360 and the laser mounting assembly 362 can be referred to individually and/or collectively as the "mounting assembly".

As provided above, in certain embodiments, the housing mounting assembly 360 is designed to secure the housing frame 356 to the mounting frame 226 in a unique fashion that allows the housing frame 356 to expand and contract relative to the mounting frame 226 (due to changes in temperature) while not distorting the housing frame 356 and the laser 358, and while maintaining alignment of the output beam 354. Moreover, in certain embodiments, the laser mounting assembly 362 is designed to secure the laser 358 to the housing frame 356 in a unique fashion (i) that allows the laser 358 to expand and contract relative to the housing frame 356 (due to changes in temperature) while not distorting the laser 358, and while maintaining alignment of the output beam 354, and (ii) that thermally and electrically isolates the laser 358 from the housing frame 356. Thus, with the design as illustrated and described herein, the mounting assembly 360, 362 couples and/or secures the laser 358 to the mounting frame 226, and allows the laser 358 to expand and contract relative to the mounting frame 226 (due to changes in temperature), while not distorting the laser 358, and while maintaining alignment of the output beam 354. The specific design of these components can be varied pursuant to the teachings provided herein.

The housing frame 356 can be designed to enclose, seal, and surround the laser 358. As illustrated in FIG. 3, the housing frame 356 can be a hollow, generally rectangular shaped body that forms a housing chamber 364 that receives and encloses the laser 358. With this design, the housing frame 356 can be used to provide a controlled environment for the laser 358. For example, the housing frame 356 can be filled with an inert gas, or another type of fluid, or the housing frame 356 can be subjected to vacuum. Additionally, the housing frame 356 can include a removable top (not shown) that provides access to the laser 358. Further, the housing frame 356 can include a transparent frame window 356A that allows the output beam 354 to exit the housing frame 356. In the embodiment illustrated in FIG. 3, the output beam 354 exits the housing frame 356 through the frame window 356A such that the output beam 354 is directed along a beam axis 354A that is coaxial with the X axis. Moreover, the mounting assembly 360, 362 as illustrated as described herein allows the laser 358 and/or the housing frame 356 to expand and contract relative to the mounting frame 226 (due to changes in temperature), while maintaining the positioning of the frame window 356A and the output beam 354.

In certain embodiments, the overall size of the housing frame 356 is quite small. For example, the housing frame 356 can have dimensions of approximately 20 centimeters (height) by 20 centimeters (width) by 20 centimeters (length) (where length is taken along the propagation direction of the output beam) or less. More preferably, in one embodiment, the housing frame 356 has dimensions of approximately 3 centimeters (height) by 4 centimeters (width) by 5 centimeters (length). Still alternatively, the housing frame 356 can have dimensions of less than approximately 10 millimeters (height) by 25 millimeters (width) by 30 millimeters (length).

The laser 358 is positioned within the housing frame 356. Additionally, the laser 358 generates the output beam 354 that is utilized by the laser source assembly 10 to generate the assembly output beam 12 (illustrated in FIG. 1). The design of the laser 358 can be varied pursuant to the teachings provided herein. The specific details of alternative embodiments of the laser 358 will be described in detail herein below.

The housing mounting assembly 360 secures the housing frame 356 to the mounting frame 226. The design of the housing mounting assembly 360 can be varied to suit the specific requirements of the laser source 340, the laser system 228 and/or the mounting frame 226. In the embodiment illustrated in FIG. 3, the housing mounting assembly 360 includes a housing frame fastener assembly 366 that secures the housing frame 356 to the mounting frame 226 and a housing frame alignment assembly 368 that maintains alignment of the housing frame 356 along a housing frame alignment axis 370.

In one embodiment, the housing frame fastener assembly 366 includes four frame fasteners 366A (also referred to herein as "fasteners") (only one is illustrated in FIG. 3), e.g., threaded bolts, with each fastener 366A fitting through a corresponding oversized (relative to the size of the fastener 366A) frame aperture 366B and threading into a corresponding internally threaded mounting frame aperture (not shown) in the mounting frame 226. With this design, because each frame aperture 366B is oversized, the housing frame fastener assembly 366 allows the housing frame 356 to expand and contract along the X axis and/or along the Y axis, while maintaining the position of the housing frame 356 along the Z axis. Alternatively, the housing frame fastener assembly 366 can be designed to include fewer than or greater than four fasteners 366A. For example, in one non-exclusive alternative embodiment, the housing frame fastener assembly 366 can be designed to include only two fasteners 366A that each extend through a corresponding oversized frame aperture 366B.

Additionally, in one embodiment, the housing frame fastener assembly 366 can further include spring washers (not illustrated) that can be used with one or more of the fasteners 366A to further enable the expansion and contraction of the housing frame 356 along the X axis and/or along the Y axis by inhibiting frictional forces between the fasteners 366A and the housing frame 356.

Further, in one embodiment, a conductor material (not illustrated), e.g., a pyrolytic graphite sheet, can be positioned substantially between the housing frame 356 and the mounting frame 226. The conductor material conducts heat, yet allows the housing frame 356 to expand and contract relative to the mounting frame 226 along the X axis and/or along the Y axis.

As provided above, the housing frame alignment assembly 368 maintains alignment of the housing frame 356 along the housing frame alignment axis 370. In FIG. 3, the housing frame alignment axis 370 is aligned along the X axis, and is parallel to and spaced apart from the beam axis 354A of the output beam 354. In this embodiment, the housing frame alignment assembly 368 includes (i) a first frame alignment pin 368A that fits snugly in a housing frame aperture 368B in the housing frame 356, and snugly in a mounting frame aperture (not shown) in the mounting frame 226, and (ii) a second frame alignment pin 368C that fits into a housing frame slot 368D in the housing frame 356, and snugly in a mounting frame aperture (not shown) in the mounting frame 226. It should be noted that the use of the housing frame aperture 368B and the housing frame slot 368D, as described herein, allow for greater manufacturing tolerances between the parts, while still maintaining the desired alignment of the housing frame 356.

In this embodiment, the housing frame slot 368D extends along the housing frame alignment axis 370, and the pins 368A, 368C and the housing frame aperture 368B are aligned along the housing frame alignment axis 370. Further, the housing frame aperture 368B is positioned on the same side of the housing frame 356 as the frame window 356A (through which the output beam 354 exits the laser 358), while the housing frame slot 368D is positioned on the opposite side of the housing frame 356 from the frame window 356A. With this design, the housing frame 356 is allowed to expand or contract in the Y direction while maintaining alignment of the housing frame 356 along the housing frame alignment axis 370. Further, the housing frame 356 is allowed to expand or contract along the X axis while maintaining the approximate position of the housing frame window 356A along the X axis.

It should be noted that, as utilized herein, the recitation of maintaining alignment of the housing frame 356 along the housing frame alignment axis 370 signifies that the housing frame slot 368D still extends along the housing frame alignment axis 370, and the pins 368A, 368C and the housing frame aperture 368B are still aligned along the housing frame alignment axis 370 despite any expansion or contraction of the housing frame 356 along the X axis and/or along the Y axis.

The laser mounting assembly 362 secures the laser 358 to the housing frame 356. The design of the laser mounting assembly 362 can be varied to suit the specific requirements of the laser source 340, the laser system 228 and/or the mounting frame 226. Alternative embodiments of the laser mounting assembly 362 will be described in detail herein below.

Figure 4A:
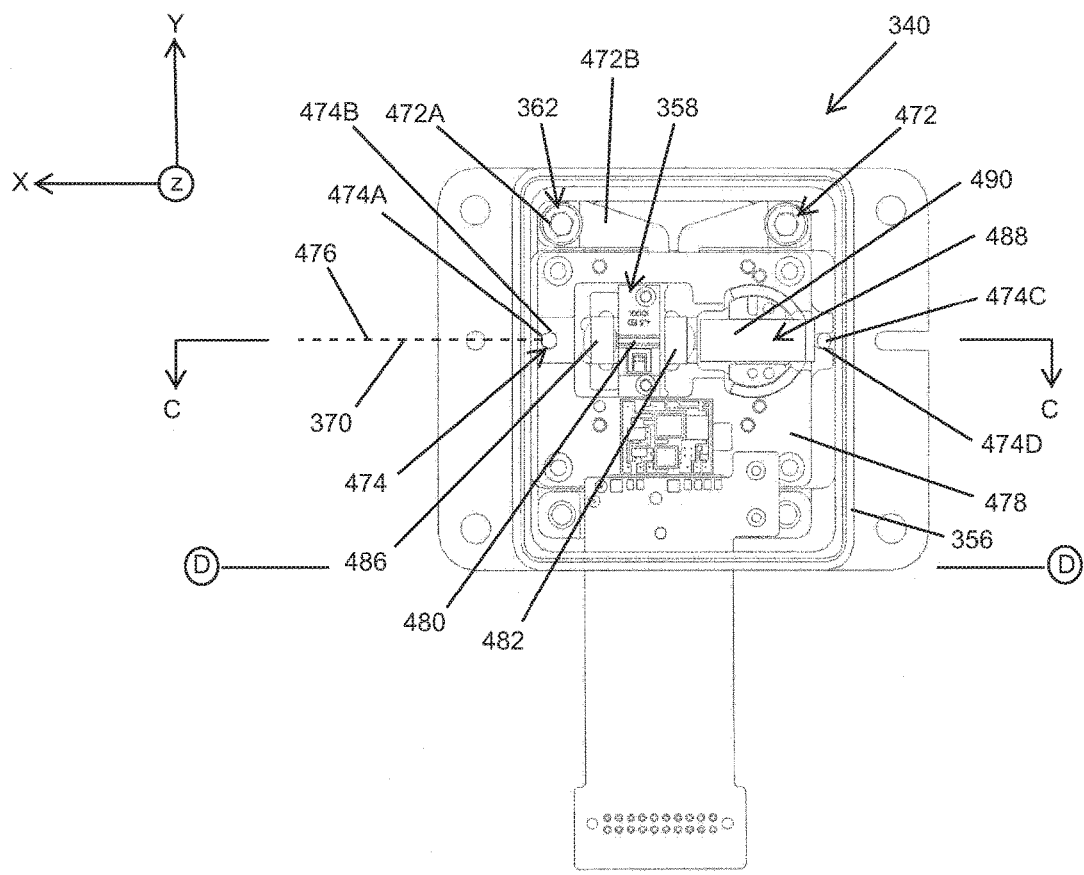
FIG. 4A is a top view of the laser source illustrated in FIG. 3, the laser source including a laser.
Figure 4B:
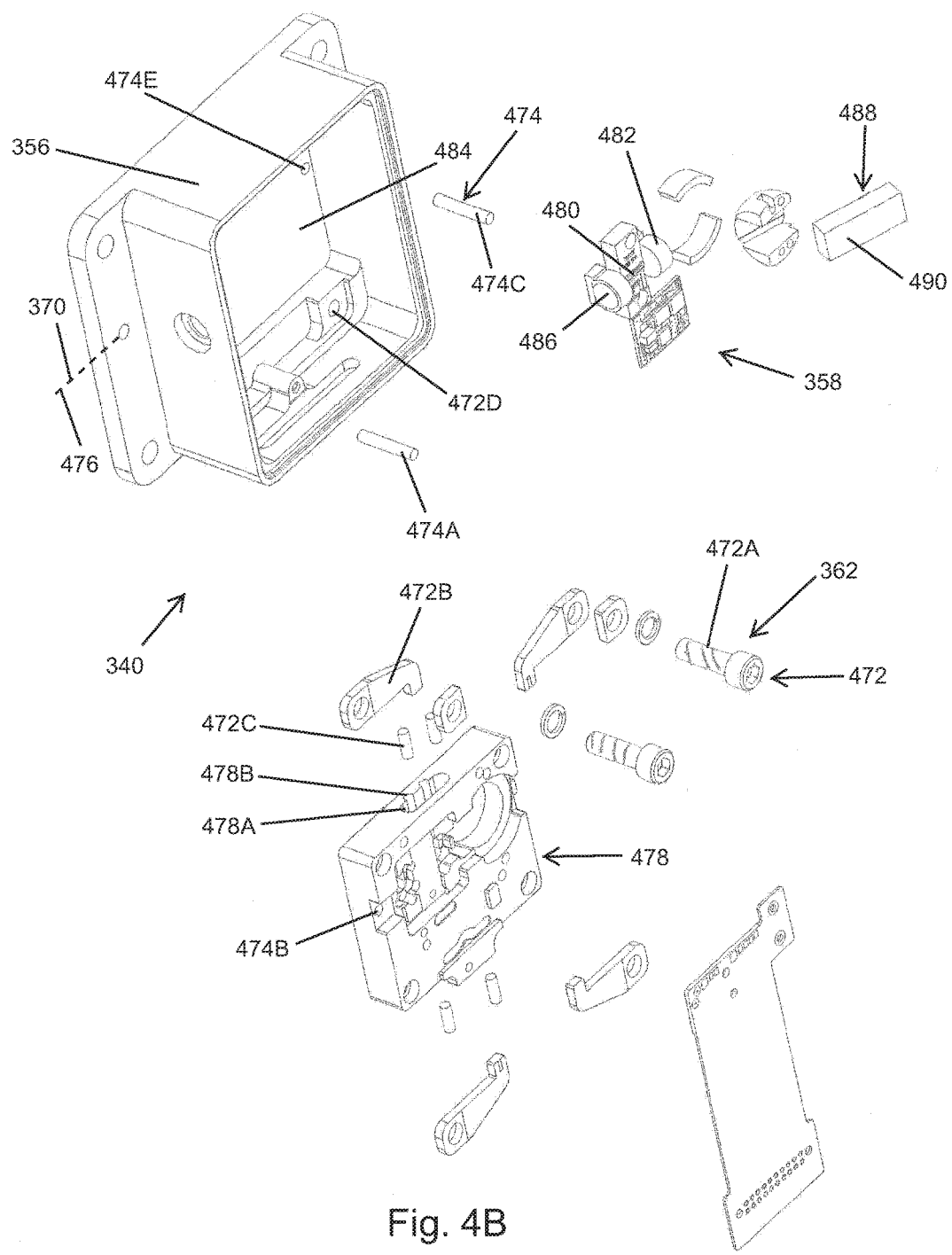
FIG. 4B is an exploded perspective view of the laser source illustrated in FIG. 4A.

FIGS. 4A and 4B are alternative views of the laser source 340 illustrated in FIG. 3. For example, FIG. 4A is a top view of the laser source 340 illustrated in FIG. 3, and FIG. 4B is an exploded perspective view of the laser source 340 illustrated in FIG. 4A. More specifically, FIGS. 4A and 4B illustrate various details of the laser 358 and the laser mounting assembly 362 illustrated in FIG. 3.

As illustrated in this embodiment, the laser mounting assembly 362 includes a laser fastener assembly 472 that secures the laser 358 to the housing frame 356 and a laser alignment assembly 474 that maintains alignment of the laser 358 along a laser alignment axis 476 that is aligned with the X axis, the housing frame alignment axis 370, and the output beam 354 (illustrated in FIG. 3). With the present design, as provided above, the laser mounting assembly 362 secures the laser 358 to the housing frame 356 in a unique fashion (i) that allows the laser 358 to expand and contract relative to the housing frame 356 (due to changes in temperature) while not distorting the laser 358, and while maintaining alignment of the output beam 354, and (ii) that thermally and electrically isolates the laser 358 from the housing frame 356.

In this embodiment, the laser 358 is an external cavity (EC), narrow linewidth, quantum cascade laser (QCL) that is packaged in a common thermally stabilized and opto-mechanically stable assembly. With this design, the output beam 354 for each laser 358 can be characterized by near-diffraction limited divergence, approximately 100 mW output optical power, narrow linewidth and specific wavelength in the MIR spectral range, selected to avoid atmospheric interferences in a said spectral range. Further, the EC-QLC provides stable, predictable spectral emission that does not change over time and does not change due to variations in temperature.

More specifically, in one embodiment, the laser 358 includes a laser frame 478, a quantum cascade ("QC") gain medium 480, a cavity optical assembly 482, a temperature controller 484, an output optical assembly 486, and a wavelength dependant ("WD") feedback assembly 488 that cooperate to generate the fixed, output beam 354. The design of each of these components can be varied pursuant to the teachings provided herein. In should be noted that the laser 358 can be designed with more or fewer components than described above.

The laser frame 478 supports the components of the laser 358. In one embodiment, (i) the QC gain medium 480, the cavity optical assembly 482, the output optical assembly 486, and the WD feedback assembly 488 are each secured, in a rigid arrangement to the laser frame 478; and (ii) the laser frame 478 maintains these components in precise mechanical alignment to achieve the desired wavelength of the output beam 354. The design of the laser frame 478 can be varied to achieve the design requirements of the laser 358. In one embodiment, the laser frame 478 is somewhat rectangular shaped and includes a pair of opposed frame apertures 478A (only one is illustrated in FIG. 4B) that are positioned on opposite sides of the laser frame 478. Further, in this embodiment, each frame aperture 478A includes a pair of spaced apart grooves 478B that are spaced apart along the X axis and that receive a portion of the laser fastener assembly 472. In this embodiment, each of the grooves 478B is shaped somewhat similar to one-half of a cylinder.

In one embodiment, the laser frame 478 is a rigid, one piece, monolithic structure that provides structural integrity to the laser 358. In certain embodiments, the laser frame 478 is made of rigid material that has a relatively high thermal conductivity. In one non-exclusive embodiment, the laser frame 478 has a thermal conductivity of at least approximately 170 watts/meter K. With this design, in addition to rigidly supporting the components of the laser 358, the laser frame 478 also readily transfers heat away from the QC gain medium 480 to the temperature controller 484. For example, the laser frame 478 can be fabricated from a single, integral piece of aluminum, copper, copper-tungsten or other material having a sufficiently high thermal conductivity. The one piece structure of the laser frame 478 maintains the fixed relationship of the components mounted thereto and contributes to the small size and portability of the laser 358.

In one non-exclusive embodiment, the QC gain medium 480 is a unipolar semiconductor laser that includes a series of energy steps built into the material matrix while the crystal is being grown. With this design, electrons transmitted through the QC gain medium 480 emit one photon at each of the energy steps. In one embodiment, the QC gain medium 480 uses two different semiconductor materials such as InGaAs and AlInAs (grown on an InP or GaSb substrate for example) to form a series of potential wells and barriers for electron transitions. The thickness of these wells/barriers determines the wavelength characteristic of the QC gain medium 480. Fabricating QC gain medium 480 of different thicknesses enables production of MIR lasers 358 having different output frequencies within the MIR range.

It should be noted that fine tuning of the output beam 354 may be achieved by controlling the temperature of the QC gain medium 480, such as by changing the DC bias current. Such temperature tuning is relatively narrow and may be used to vary the wavelength by approximately one to two gigahertz/Kelvin which is typically less than 0.01% of the peak emission wavelength.

In the case of QC gain medium 480, the "diode" has been replaced by a conduction band quantum well. Electrons are injected into the upper quantum well state and collected from the lower state using a superlattice structure. The upper and lower states are both within the conduction band. Replacing the diode with a single-carrier quantum well system means that the generated photon energy is no longer tied to the material bandgap. This removes the requirement for exotic new materials for each wavelength, and also removes Auger recombination as a problem issue in the active region. The superlattice and quantum well can be designed to provide lasing at almost any photon energy that is sufficiently below the conduction band quantum well barrier.

As used herein the term QC gain medium 480 shall also include Interband Cascade Lasers (ICL). ICL lasers use a conduction-band to valence-band transition as in the traditional diode laser. In one, non-exclusive embodiment, the semiconductor QCL laser chip is mounted epitaxial growth side down and has a length of approximately four millimeters, a width of approximately one millimeter, and a height of approximately one hundred microns. A suitable QC gain medium 480 can be purchased from Alpes Lasers, located in Switzerland.

In one embodiment, the QC gain medium 480 includes (i) a first facet that faces the cavity optical assembly 482 and the WD feedback assembly 488, and (ii) a second facet that faces the output optical assembly 486. In this embodiment, the QC gain medium 480 emits from both facets. In one embodiment, the first facet is coated with an anti-reflection ("AR") coating and the second facet is coated with a reflective coating. The AR coating on the first facet allows light directed from the QC gain medium 480 at the first facet to easily exit the QC gain medium 480 and allows the light reflected from the WD feedback assembly 488 to easily enter the QC gain medium 480. In contrast, the reflective coating on the second facet reflects at least some of the light that is directed at the second facet from the QC gain medium 480 back into the QC gain medium 480. In one non-exclusive embodiment, the AR coating can have a reflectivity of less than approximately two percent, and the reflective coating can have a reflectivity of between approximately two and ninety-five percent. In this embodiment, the reflective coating acts as an output coupler for the external cavity.

The QC gain medium 480 generates a relatively strong output IR beam and also generates quite a bit of heat. Accordingly, the temperature controller 484 can be an important component that is needed to remove the heat, thereby permitting long lived operation of the laser source 340.

The cavity optical assembly 482 is positioned between the QC gain medium 480 and the WD feedback assembly 488 along the lasing axis (e.g., along the X axis in FIG. 4A), and collimates and focuses the light that passes between these components. In certain embodiments, the cavity optical assembly 482 can include one lens or more than one lens. For example, in one embodiment, the cavity optical assembly 482 can include an aspherical lens having an optical axis that is aligned with the lasing axis. Moreover, in some embodiments, to achieve the desired small size and portability, the lens has a relatively small diameter. In alternative, non-exclusive embodiments, the lens has a diameter of less than approximately 5 or 10 millimeters, and a focal length of approximately 1, 2, 3, 4, 5, 6, 7, 8, 9, 10, 11, 12, 13, 14, 15, 16, 17, 18, 19, or 20 mm and any fractional values thereof. The lens can comprise materials selected from the group of Ge, ZnSe, ZnS Si, CaF, BaF or chalcogenide glass. However, other materials may also be utilized. The lens may be made using a diamond turning or molding technique. The lens can be designed to have a relatively large numerical aperture (NA). For example, the lens can have a numerical aperture of at least approximately 0.6, 0.7, or 0.8. The NA may be approximated by the lens diameter divided by twice the focal length. Thus, for example, a lens diameter of 5 mm having a NA of 0.8 would have a focal length of approximately 3.1 mm.

The temperature controller 484 can be used to control the temperature of the QC gain medium 480, the laser frame 478, and/or one or more of the other components of the laser 358. In one embodiment, the temperature controller 484 includes a thermoelectric cooler ("TEC") and a temperature sensor. The thermoelectric cooler may be controlled to effect cooling or heating depending on the polarity of the drive current provided thereto. In one embodiment, the thermoelectric cooler is positioned between the bottom of the laser frame 478 and the housing frame 356 (i) so that the thermoelectric cooler is in direct thermal communication with the laser frame 478, (ii) so that the thermoelectric cooler can provide additional rigidity and support to the laser frame 478, and (iii) so that the thermoelectric cooler inhibits the transfer of heat from the laser 358 to the housing frame 356. In one embodiment, the TEC has approximately the same footprint as the laser frame 478. The temperature sensor (e.g., a thermistor) provides temperature information that can be used to control the operation of the thermoelectric cooler so that the thermoelectric cooler can maintain the desired temperature of the laser 358.

The output optical assembly 486 is positioned between the QC gain medium 480 and the frame window 356A in line with the lasing axis. Additionally, the output optical assembly 486 collimates and focuses the light that exits the second facet of the QC gain medium 480. For example, in certain embodiments, the output optical assembly 486 can include one lens or more than one lens that can be somewhat similar in design to the lens or lenses of the cavity optical assembly 482.

The WD feedback assembly 488 reflects light back to the QC gain medium 480 along the lasing axis, and is used to precisely adjust the lasing frequency of the external cavity and the wavelength of the output beam 354. In this manner, the output beam 354 may be tuned and set to a desired fixed wavelength with the WD feedback assembly 488 without adjusting the QC gain medium 480. Thus, in the external cavity arrangements disclosed herein, the WD feedback assembly 488 dictates what wavelength will experience the most gain and thus dominate the wavelength of the output beam 354.

In certain embodiments, the WD feedback assembly 488 includes a wavelength dependent ("WD") reflector 490 that cooperates with the reflective coating on the second facet of the QC gain medium 480 to form the external cavity. The term external cavity is utilized to designate the WD reflector 490 positioned outside of the QC gain medium 480.

With the present invention, the laser 358 can be individually tuned so that the output beam 354 is at a wavelength that allows for maximum transmission through and minimum attenuation by the atmosphere 17 (illustrated in FIG. 1). Stated in another fashion, the wavelength of each output beam 354 is specifically selected to avoid the wavelengths that are readily absorbed by the water or carbon dioxide that are readily found in the atmosphere 17. In alternative, non-exclusive embodiments, the WD feedback assembly 488 can be used to control the fixed wavelength of the output beam 354 within the MIR range to within approximately 0.1, 0.01, 0.001, or 0.0001 microns. As one non-exclusive example, the WD feedback assembly 488 can be adjusted so that the laser 358 has an output beam 354 of (i) 4.625 microns, (ii) 4.626 microns, (iii) 4.627 microns, (iv) 4.628 microns, (v) 4.629 microns, (vi) 4.630 microns, or any other specific wavelength in the MIR range. In certain embodiments, with the designs provided herein, the output beam 354 has a relatively narrow linewidth. In non-exclusive examples, the laser 358 can be designed so that the linewidth of the output beam 354 is less than approximately 5, 4, 3, 2, 1, 0.8, or 0.5 cm$^{-1}$.

The design of the WD feedback assembly 488 and the WD reflector 490 can vary pursuant to the teachings provided herein. Non-exclusive examples of a suitable WD reflector 490 includes a diffraction grating, a MEMS grating, prism pairs, a thin film filter stack with a reflector, an acoustic optic modulator, or an electro-optic modulator. A more complete discussion of these types of WD reflectors 490 can be found in the Tunable Laser Handbook, Academic Press, Inc., Copyright 1995, chapter 8, Pages 349-435, Paul Zorabedian.

It should be noted that the laser 358 can be powered by a generator, e.g., the generator for the aircraft 14 (illustrated in FIG. 1), a battery, or another power source.

As provided above, the laser fastener assembly 472 secures the laser 358, including the laser frame 478, to the housing frame 356. In one embodiment, the laser fastener assembly 472 includes (i) four laser fasteners 472A (also referred to herein as "fasteners") (only two are illustrated in FIG. 4B), e.g., threaded bolts, (ii) four resilient assemblies 472B (e.g., spring steel beams), and (iii) four engagement rods 472C (e.g., cylindrical rods) positioned in the grooves 478B. The fasteners 472A, the resilient assemblies 472B and the engagement rods 472C cooperate to resiliently urge the laser frame 478 towards the housing frame 356 with the temperature controller 484 positioned therebetween. In this embodiment, each resilient assembly 472B includes a proximal end and a distal end. Further, each fastener 472A extends through an aperture in the proximal end of one of the resilient assemblies 472B and is threaded into an internally threaded surface 472D in the housing frame 356. Further, the distal end of each resilient assembly 472B urges a corresponding one of the engagement rods 472C against the laser frame 478, i.e. into the grooves 478B of the laser frame 478. Alternatively, the laser fastener assembly 472 can be designed to include fewer than or greater than four fasteners 472A, fewer than or greater than four resilient assemblies 472B, and/or fewer than or greater than four engagement rods 472C.

With this design, (i) the flexing characteristics of the resilient assemblies 472B can be tuned to specifically control the amount of force that is applied to the laser frame 478 to mechanically hold the laser frame 478 against the temperature controller 484 and the housing frame 356; (ii) the resilient assemblies 472B provide a substantially uniform, non-bending pressure to the laser frame 478 and the temperature controller 484; (iii) the pressure is applied by the resilient assemblies 472B to the laser frame 478 so as to minimize the likelihood of bending the laser frame 478 (i.e. to inhibit bending of the laser frame 478); (iv) an interface between resilient assemblies 472B and the engagement rods 472C forms a line contact between the rods 472C and the resilient assemblies 472B that minimizes the amount of heat transferred, i.e. that inhibits heat transfer, between the laser frame 478 and the housing frame 356 via the laser fastener assembly 472, thereby providing thermal isolation between the laser frame 478 and the housing frame 356; (v) the rods 472C can be made of electrically insulating sapphire (or another electrically insulating material) to provide electrical isolation between the housing frame 356 and the laser frame 478; (iv) the arrangement of the engagement rods 472C allows the laser frame 478 to expand or contract along the X axis and along the Y axis relative to the housing frame 356, while urging the laser frame 478 against the temperature controller 484 (i.e. while maintaining the approximate position of the laser frame 478 relative to the housing frame 356 along the Z axis).

Additionally, in one embodiment, a conductor material (not illustrated), e.g., a pyrolytic graphite sheet, can be positioned substantially between the laser frame 478 and the housing frame 356. The conductor material conducts heat, yet allows the laser frame 478 to expand and contract relative to the housing frame 356 along the X axis and/or along the Y axis.

The laser alignment assembly 474 maintains alignment of the laser 358 along the laser alignment axis 476. In FIG. 4A, the laser alignment axis 476 is aligned with the housing frame alignment axis 370 along the X axis, and is parallel to and spaced apart from the beam axis 354A (illustrated in FIG. 3) of the output beam 354 and the lasing axis of the laser 358. In this embodiment, the laser alignment assembly 474 includes (i) a first laser alignment pin 474A that fits snugly in a laser frame aperture 474B in the laser frame 478, and snugly in a housing frame aperture (not shown) in the housing frame 356, and (ii) a second laser alignment pin 474C that fits into a laser frame slot 474D in the laser frame 478, and snugly in a housing frame aperture 474E in the housing frame 356. It should be noted that the use of the laser frame aperture 474B and the laser frame slot 474D, as described herein, allow for greater manufacturing tolerances between the parts, while still maintaining the desired alignment of the laser 358.

In this embodiment, the laser frame slot 474D extends along the laser alignment axis 476, and the pins 474A, 474C, the laser frame aperture 474B and the housing frame apertures 474E are aligned along the laser alignment axis 476. Further, the laser frame aperture 474B is positioned on the same side of the laser frame 478 as the output of the laser 358, while the laser frame slot 474D is positioned on the opposite side of the laser frame 478. With this design, the laser frame 478 is allowed to expand or contract in the Y direction while maintaining alignment of the laser frame 478 along the laser alignment axis 476. Further, the laser frame 478 is allowed to expand or contract along the X axis while maintaining the approximate position of the output optical assembly 486 along the X axis.

It should be noted that, as utilized herein, the recitation of maintaining alignment of the laser 358 along the laser alignment axis 476 signifies that the laser frame slot 474D still extends along the laser alignment axis 476, and the pins 474A, 474C, the laser frame aperture 474B and the housing frame apertures 474E are still aligned along the laser alignment axis 476 despite any expansion or contraction of the laser, including the laser frame 478, along the X axis and/or along the Y axis.

Figure 4C:
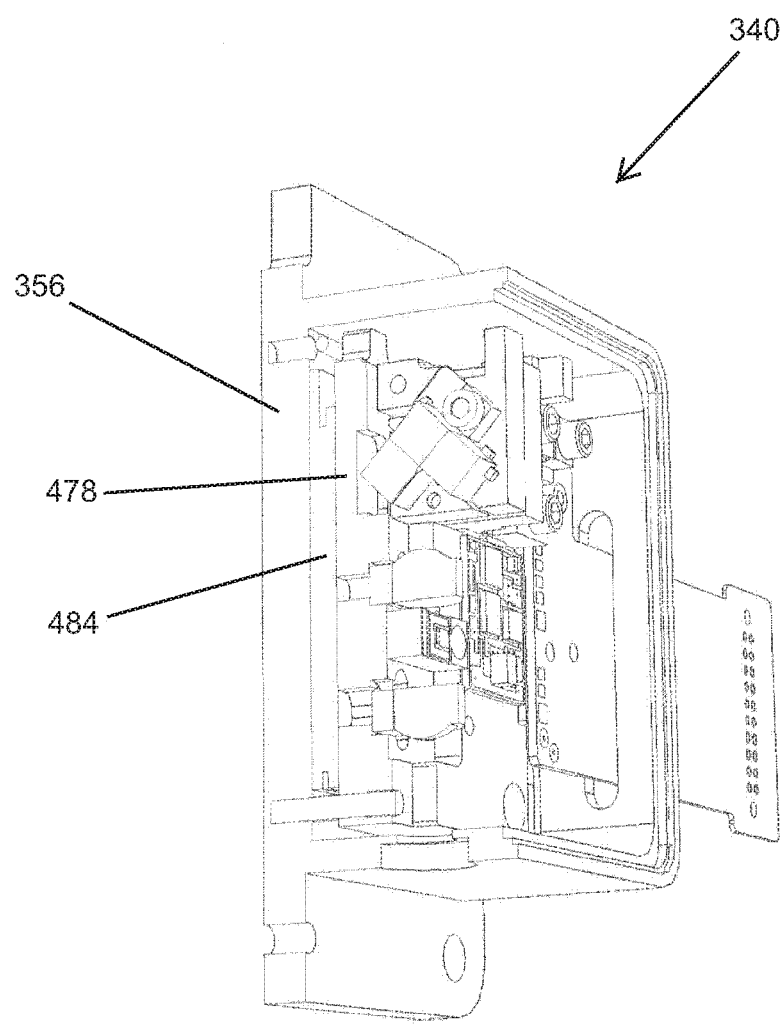
FIG. 4C is a perspective cutaway view of the laser source taken along line C-C in FIG. 4A.

FIG. 4C is a perspective cutaway view of the laser source 340 taken along line C-C in FIG. 4A. FIG. 4C illustrates certain details of the structural and functional relationship among the laser frame 478, the temperature controller 484, and the housing frame 356. More specifically, FIG. 4C illustrates that the laser frame 478 is positioned above the temperature controller 484, and the laser frame 478 urges the temperature controller 484 against the housing frame 356.

Figure 4D:
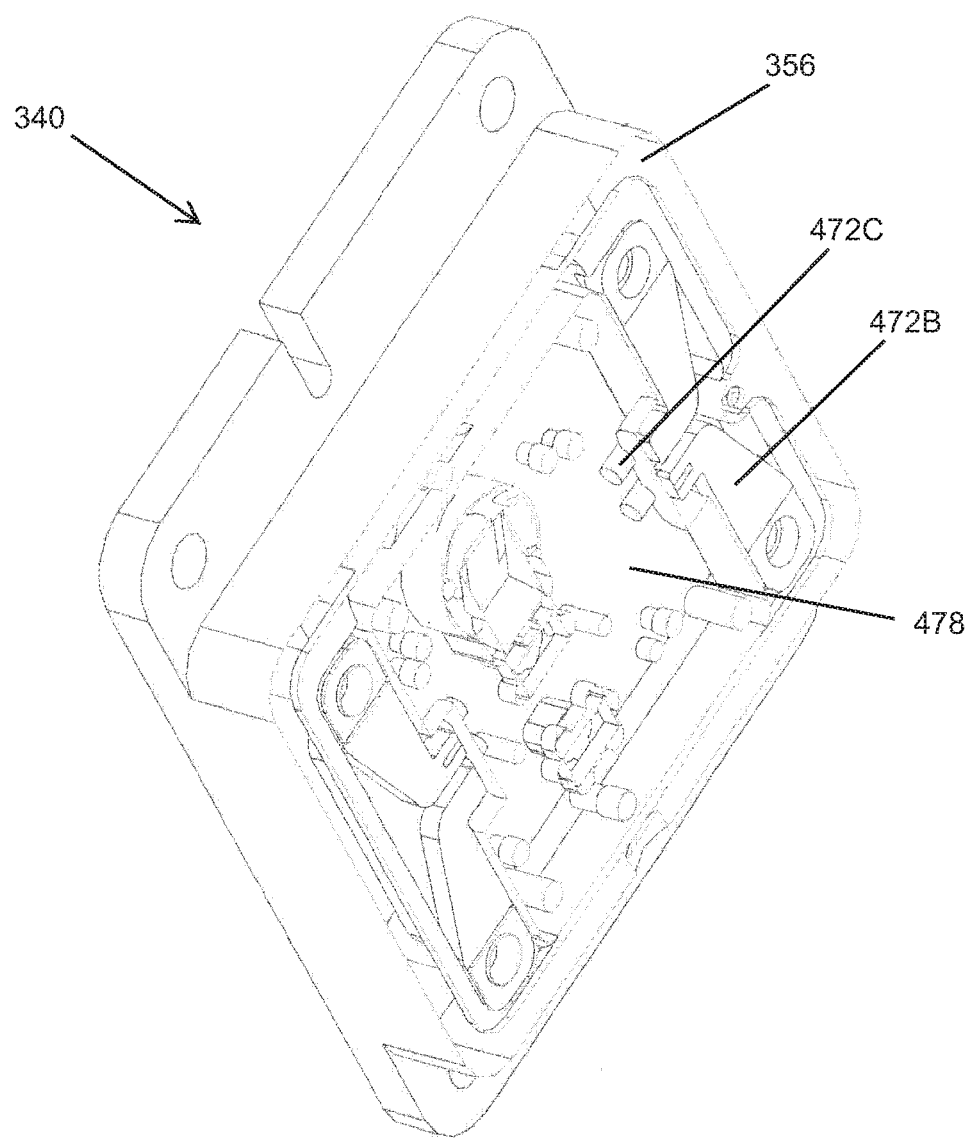
FIG. 4D is a perspective cutaway view of the laser source taken along line D-D in FIG. 4A.

FIG. 4D is a perspective cutaway view of the laser source 340 taken along line D-D in FIG. 4A. FIG. 4D illustrates certain details of the structural and functional relationship among the resilient assemblies 472B, the engagement rods 472C, the laser frame 478, and the housing frame 356. More specifically, FIG. 4D illustrates that each of the resilient assemblies 472B urges its respective engagement rod 472C against the laser frame 478, and thus urges the laser frame 478 toward the housing frame 356.

Figure 5:
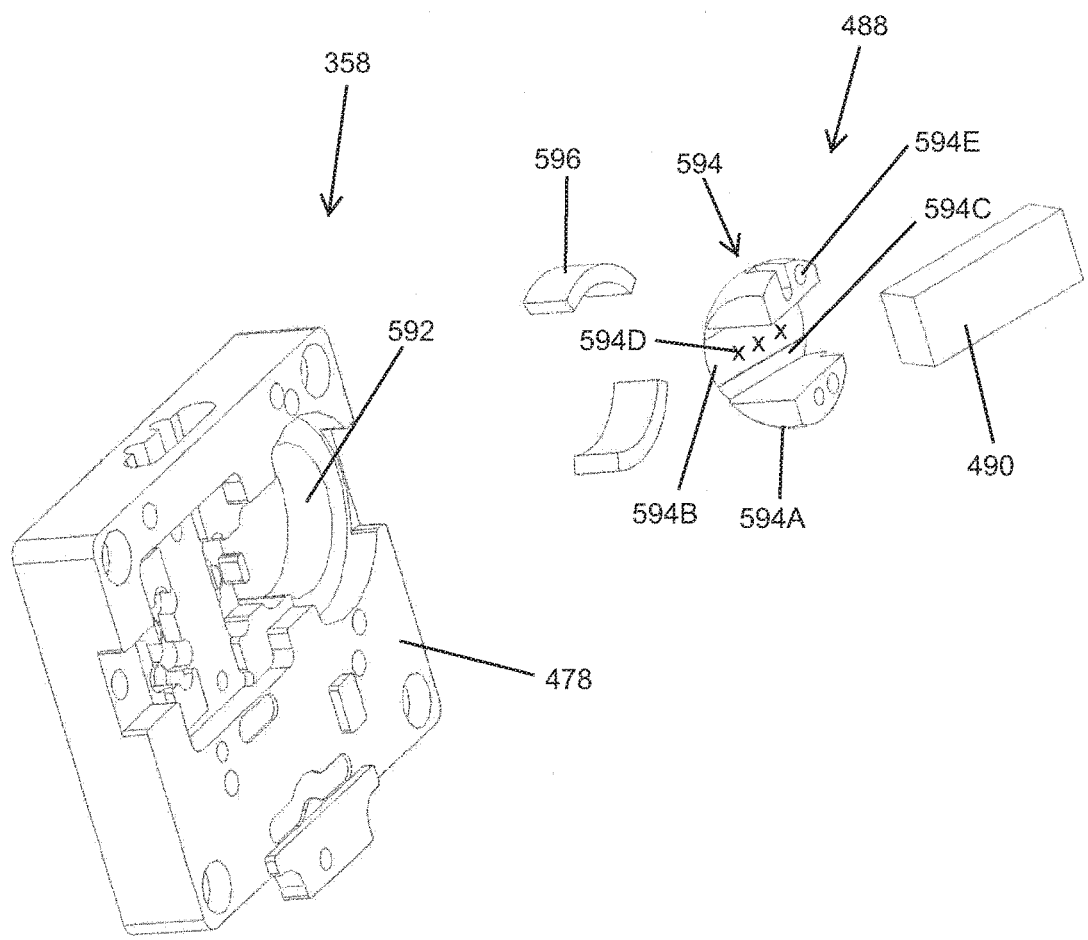
FIG. 5 is an exploded perspective view of a portion of the laser illustrated in FIG. 4A.

FIG. 5 is an exploded perspective view of a portion of the laser 358 illustrated in FIG. 4A. In particular, FIG. 5 illustrates a portion of the laser frame 478 and one non-exclusive embodiment of the WD feedback assembly 488. As provided herein, the WD reflector 490 can be tuned to adjust the lasing frequency of the external cavity and the wavelength of the output beam 354 (illustrated in FIG. 3), and the relative position of the WD reflector 490 can be adjusted to tune the laser 358. More specifically, the WD reflector 490 can be tuned to cause the laser 358 to generate the output beam 354 that is fixed at a precisely selected, specific wavelength in the MIR range.

The type of adjustment done to the WD reflector 490 to adjust the lasing frequency of the external cavity and the wavelength of the output beam 354 will vary according to the type of WD reflector 490. For example, in FIG. 5, the WD reflector 490 is a diffraction grating. In this embodiment, rotation of the diffraction grating 490 relative to the lasing axis and the QC gain medium 480 (illustrated in FIG. 4A) adjusts the lasing wavelength and the wavelength of the output beam 354. There are many different ways to precisely rotate and fix the position of the diffraction grating.

In FIG. 5, the laser frame 478 includes a semi-spherical shaped, laser frame aperture 592 that receives a portion of the WD feedback assembly 488. Further, in this embodiment, the WD feedback assembly 488 includes a reflector retainer 594, one or more reflector locks 596, and the WD reflector 490. In FIG. 5, the WD reflector 490 is generally rectangular shaped. Further, the reflector retainer 594 includes (i) a generally semi-spherical shaped outer region 594A that fits into and moves in the laser frame aperture 592, and (ii) a retainer slot 594B that receives the WD reflector 490. Moreover, in this embodiment, the retainer slot 594B includes a pair of spaced apart hard rails 594C that support the WD reflector 490, and an adhesive 594D (illustrated with X's) can be positioned between the hard rails 594C to fixedly secure the WD reflector 490 to the reflector retainer 594 while precisely positioning the WD reflector 490 against the hard rails 594C.

Further, the WD feedback assembly 488 can be designed so that the pivot point of the reflector retainer 594 is approximately on the lasing axis. Moreover, the reflector retainer 594 can include one or more tooling interfaces 594E that facilitate the movement of the reflector retainer 594 with a movement tool (not shown). With this design, the reflector retainer 594 and the WD reflector 490 can be precisely rotated about multiple axes (pitch and yaw) to adjust the wavelength and maximize the power of the output beam 354. Additionally, the WD reflector 490 can be adjusted along the X axis to adjust the length of the external cavity as desired.

After the WD reflector 490 and reflector retainer 594 are moved to the desired position, the reflector lock 596 can be used to lock the position of the WD reflector 490 relative to the lasing axis and the QC gain medium 488 to provide a permanent six degree of freedom attachment. In FIG. 5, the reflector lock 596 includes a pair of spaced apart, arch shaped retainer members that permanently secure the reflector retainer 594 to the laser frame 478. In one embodiment, each of the retainer members is transparent to ultraviolet light ("UV"), and a UV activated adhesive is used to adhere (i) each retainer member to the reflector retainer 594, and (ii) each retainer member to the laser frame 478.

With this design, the position of the WD reflector 490 is adjusted using tooling that moves the reflector retainer 594 in the ball and socket type arrangement within the laser frame aperture 592. Subsequently, the UV activated adhesive is applied (i) between each retainer member and the reflector retainer 594, and (ii) between each retainer member and the laser frame 478. Next, the UV adhesive is cured by exposure to UV light through the retainer members. This fixes the position of the WD reflector 490. Additionally, a final oven cure can be applied to the adhesives.

It should be noted that with the present design, because (i) the adhesive is positioned between each retainer member and the reflector retainer 594, and (ii) the adhesive is positioned between each retainer member and the laser frame 478, any shrinkage of the adhesive will move the respective retainer member without moving the WD reflector 490. Further, the WD reflector 490 is retained against the hard rails 594C. Thus, the position of the WD reflector 490 will be maintained even if any of the adhesive shrinks, and there is minimal motion of the grating during the locking procedure.

Additionally, it should be noted that the position of the WD reflector 490 can be adjusted during manufacturing to obtain the desired wavelength of the output beam 354, and can subsequently be locked and fixed in place.

While a number of exemplary aspects and embodiments of a laser source 340 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A laser source that generates an output beam that is directed along a beam axis that is coaxial with a first axis and orthogonal to a second axis, the laser source comprising:
   a first frame;
   a laser that is adapted to generate the output beam that is directed along the beam axis, the laser including a second frame; wherein at least one of the first frame and the second frame includes a groove; and
   a mounting assembly that couples the laser to the first frame, the mounting assembly including a fastener assembly that couples the laser to the first frame, and an alignment assembly that maintains alignment of the laser along an alignment axis that is substantially parallel to the first axis; wherein the fastener assembly allows the second frame to expand and contract relative to the first frame along the first axis and along the second axis; and wherein the fastener assembly includes an engagement rod that fits into the groove and a resilient assembly that urges the engagement rod into the groove to urge the second frame toward the first frame.

2. The laser source of claim 1 wherein the fastener assembly includes a plurality of fasteners, each fastener being adapted to fit within an oversized frame aperture in the first frame.

3. The laser source of claim 1 wherein the fastener assembly thermally and electrically isolates the second frame from the first frame.

4. The laser source of claim 1 wherein an interface between the resilient assembly and the engagement rod forms a line contact between the resilient assembly and the engagement rod that inhibits heat from being transferred between the second frame and the first frame, thereby providing thermal isolation between the second frame and the first frame.

5. The laser source of claim 1 wherein the engagement rod is made of an electrically insulating material to provide electrical isolation between the second frame and the first frame.

6. The laser source of claim 1 wherein the alignment assembly includes a first alignment pin that fits snugly within a first frame aperture in the first frame, and a second alignment pin that fits into a first frame slot in the first frame, the first frame slot extending along the alignment axis, and the alignment pins and the first frame aperture being aligned along the alignment axis.

7. The laser source of claim 1 further comprising a temperature controller that is positioned between the first frame and the second frame, and wherein the resilient assembly urges the second frame toward the first frame with the temperature controller positioned therebetween.

8. A laser source that generates an output beam that is directed along a beam axis that is coaxial with a first axis and orthogonal to a second axis, the laser source comprising:
a housing frame;
a laser that is adapted to generate the output beam that is directed along the beam axis;
a laser frame that retains the laser, wherein at least one of the housing frame and the laser frame includes a groove; and
a laser fastener assembly that couples the laser frame to the housing frame, the laser fastener assembly including an engagement rod that fits at least partly into the groove and a resilient assembly that urges the engagement rod into the groove to urge the laser frame toward the housing frame.

9. The laser source of claim 8 wherein an interface between the resilient assembly and the engagement rod forms a line contact between the resilient assembly and the engagement rod that inhibits heat from being transferred between the laser frame and the housing frame, thereby providing thermal isolation between the laser frame and the housing frame; and wherein the engagement rod is made of an electrically insulating material to provide electrical isolation between the laser frame and the housing frame.

10. The laser source of claim 8 wherein the laser frame includes a plurality of grooves, and the laser fastener assembly includes a separate engagement rod and a separate resilient assembly for each of the grooves.

11. The laser source of claim 8 further comprising a laser alignment assembly that maintains alignment of the laser housing along a laser alignment axis that is substantially parallel to the first axis, the laser alignment assembly including a first laser alignment pin that fits within a laser frame aperture in the laser frame, and a second laser alignment pin that fits into a laser frame slot in the laser frame, the laser frame slot extending along the laser alignment axis, and the laser alignment pins and the laser frame aperture being aligned along the laser alignment axis.

12. The laser source of claim 11 further comprising a mounting frame, and a housing mounting assembly that couples the housing frame to the mounting frame, the housing mounting assembly allowing the housing frame to expand and contract relative to the mounting frame along the first axis and along the second axis, while maintaining alignment of the output beam so the beam axis is substantially coaxial with the first axis.

13. The laser source of claim 12 further comprising a housing frame alignment assembly that maintains alignment of the housing frame along a housing alignment axis that is substantially parallel to the first axis, the housing frame alignment assembly including a frame alignment pin that fits within a housing frame aperture in the housing frame.

14. The laser source of claim 8 wherein the laser fastener assembly allows the laser frame to expand and contract relative to the housing frame along the first axis and along the second axis, while maintaining alignment of the output beam so the beam axis is substantially coaxial with the first axis.

15. The laser source of claim 14 further comprising a mounting frame, and a housing mounting assembly that couples the housing frame to the mounting frame, the housing mounting assembly allowing the housing frame to expand and contract relative to the mounting frame along the first axis and along the second axis, while maintaining alignment of the output beam so the beam axis is substantially coaxial with the first axis.

16. The laser source of claim 8 further comprising a temperature controller positioned between the laser frame and the housing frame.

17. The laser source of claim 8 further comprising a mounting frame, and a housing mounting assembly that couples the housing frame to the mounting frame, the housing mounting assembly allowing the housing frame to expand and contract relative to the mounting frame along the first axis and along the second axis, while maintaining alignment of the output beam so the beam axis is substantially coaxial with the first axis.

18. A method for generating an output beam that is directed along a beam axis that is coaxial with a first axis and orthogonal to a second axis, the method comprising:
providing a housing frame;
generating an output beam directed along the beam axis with a laser;
retaining the laser with a laser frame, wherein at least one of the housing frame and the laser frame includes a first groove; and
coupling the laser frame to the housing frame with a first engagement rod that fits at least partly into the first groove and a first resilient assembly that urges the first engagement rod into the first groove to urge the laser frame toward the housing frame.

19. The method of claim 18 further comprising maintaining alignment of the laser housing along a laser alignment axis that is substantially parallel to the first axis with a laser alignment assembly that includes a first laser alignment pin that fits within a laser frame aperture in the laser frame, and a second laser alignment pin that fits into a laser frame slot in the laser frame, the laser frame slot extending along the laser alignment axis, and the laser alignment pins and the laser frame aperture being aligned along the laser alignment axis.

20. The method of claim 18 wherein at least one of the housing frame and the laser frame includes a second groove, and wherein the step of coupling includes positioning a second engagement rod into the second groove, and urging the second engagement rod into the second groove with a second resilient assembly.

* * * * *